US012664336B2

(12) United States Patent
Colombo et al.

(10) Patent No.: US 12,664,336 B2
(45) Date of Patent: Jun. 23, 2026

(54) MACHINE LEARNING INVERSION USING BAYESIAN INFERENCE AND SAMPLING

(71) Applicant: SAUDI ARABIAN OIL COMPANY, Dhahran (SA)

(72) Inventors: Daniele Colombo, Dhahran (SA); Anton Egorov, Moscow (RU); Ersan Turkoglu, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 1140 days.

(21) Appl. No.: 17/693,261

(22) Filed: Mar. 11, 2022

(65) Prior Publication Data

US 2023/0289499 A1 Sep. 14, 2023

(51) Int. Cl.
*G06F 30/27* (2020.01)
*G01V 1/28* (2006.01)

(52) U.S. Cl.
CPC .............. *G06F 30/27* (2020.01); *G01V 1/282* (2013.01)

(58) Field of Classification Search
CPC .............. G06F 30/27; G01V 2210/667; G01V 2210/665; G01V 20/00; G01V 1/282;
(Continued)

(56) References Cited

U.S. PATENT DOCUMENTS 8,245,795 B2 * 8/2012 Dennis .................. E21B 47/047
175/45
8,363,509 B2 1/2013 Colombo et al.
(Continued)

FOREIGN PATENT DOCUMENTS

CN 109313724 B 6/2021
EP 2020609 A1 2/2009
(Continued)

OTHER PUBLICATIONS

Of Figueiredo et a Gaussian Mixture McMC method for linear seismic inversion, Geophysics, 2019 (Year: 2019).*
(Continued)

*Primary Examiner* — Ryan F Pitaro
*Assistant Examiner* — Adrian Stoica
(74) *Attorney, Agent, or Firm* — Osha Bergman Watanabe & Burton LLP

(57) ABSTRACT

Methods may include obtaining a preprocessed observed geophysical dataset based on an observed geophysical dataset of the subterranean region of interest and forming a training dataset composed of a geophysical training models and corresponding simulated geophysical training datasets. The methods may further include iteratively determining a simulated geophysical dataset from a current geophysical model, determining a data loss function between the preprocessed observed geophysical dataset and the simulated geophysical dataset, and training a machine learning (ML) network, using the training dataset, to predict a predicted geophysical model. The methods may still further include determining a model loss function between the current and predicted geophysical models and updating the current geophysical model based on an inversion using the data loss and model loss functions.

10 Claims, 13 Drawing Sheets

(58) Field of Classification Search

CPC ............. G01V 99/00; G01V 2210/614; G01V 2210/64; G01V 2210/66

See application file for complete search history.

(56) References Cited

U.S. PATENT DOCUMENTS

| | | | | |
|---|---|---|---|---|
| 8,861,308 | B2 | 10/2014 | Virgilio et al. | |
| 8,923,094 | B2 | 12/2014 | Jing et al. | |
| 10,261,215 | B2 | 4/2019 | Miotti et al. | |
| 10,920,585 | B2 | 2/2021 | Colombo et al. | |
| 10,996,372 | B2 * | 5/2021 | Denli | G06N 3/04 |
| 2016/0086079 | A1 | 3/2016 | De Stefano | |
| 2019/0195067 | A1 | 6/2019 | Colombo et al. | |
| 2019/0383965 | A1 | 12/2019 | Salman et al. | |
| 2020/0088896 | A1 | 3/2020 | Schmedes et al. | |
| 2020/0183031 | A1 | 6/2020 | Denli et al. | |
| 2020/0183035 | A1 * | 6/2020 | Liu | G06N 20/00 |
| 2020/0183041 | A1 | 6/2020 | Denli et al. | |
| 2020/0184374 | A1 | 6/2020 | Liu et al. | |
| 2020/0257016 | A1 | 8/2020 | Abdallah et al. | |
| 2021/0041596 | A1 | 2/2021 | Kushwaha et al. | |
| 2021/0239872 | A1 | 8/2021 | Wheelock et al. | |
| 2021/0264262 | A1 | 8/2021 | Colombo et al. | |

FOREIGN PATENT DOCUMENTS

| | | | |
|---|---|---|---|
| WO | 2020257263 | A1 | 12/2020 |
| WO | 2021130512 | A1 | 7/2021 |
| WO | 2021168230 | A1 | 8/2021 |

OTHER PUBLICATIONS

Figueiredo et al Gaussian Mixture McMC method for linear seismic inversion, Geophysics, 2019 (Year: 2019).*

Gaussian Process Regression within an active learning scheme, IGARSS 2011 (Year: 2011).*

CN 113553773, Wu et al, Original and translation (Year: 2021).*

Of Pasolli, et al Gaussian Process Regression within an active learning scheme, IGARSS 2011 (Year: 2011).*

Colombo D. et al., "High-resolution velocity modeling by seismic-airborne TEM joint inversion: a new perspective for hear surface characterization", The Leading Edge, vol. 35, Nov. 2016, pp. 977-985 (9 pages).

Colombo, D. and M. De Stefano, "Geophysical modeling via simultaneous joint inversion of seismic, gravity, and electromagnetic data: Application to prestack depth imaging", The Leading Edge, vol. 26, Mar. 2007, pp. 326-331 (6 pages).

Ronneberger, O. et al., "U-net: Convolutional Networks for Biomedical Image Segmentation", May 2015, pp. 1-8, URL: <https://arxiv.org/abs/1505.04597v1> (8 pages).

Rovetta, Diego and Daniele Colombo, "Analysis of inter-domain coupling constraints for multi-physics joint inversion", Inverse Problems, IOP Publishing Ltd., vol. 34, Nov. 2018, pp. 1-31 (31 pages).

Naeini, Ehsan Zabihi, "A machine learning approach to quantitative interpretation", SEG International Exposition and 89th Annual Meeting, SEG, 2019, pp. 3176-3180 (5 pages).

Biswas, Reetam et al., "Prestack and poststack inversion using a physics-guided convolutional neural network", Interpretation, Society of Exploration Geophysicists and American Association of Petroleum Geologists, vol. 7, No. 3, Aug. 2019, pp. SE161-SA174 (14 pages).

Colombo, Daniele et al., "Deep-learning electromagnetic monitoring coupled to fluid flow simulators", Geophysics, Society of Exploration Geophysicists, vol. 85, No. 4, Jul.-Aug. 2020, pp. WA1-WA12 (12 pages).

Dogru, Ali H. et al., "A Next-Generation Parallel Reservoir Simulator for Giant Reservoirs", SPE 119272, Society of Petroleum Engineers, Feb. 2009, pp. 1-29 (29 pages).

Archie, G.E., "The Electrical Resistivity Log as an Aid in Determining Some Reservoir Characteristics", T.P. 1422, Petroleum Technology, Jan. 1942, pp. 54-62 (9 pages).

International Search Report and Written Opinion of the International Searching Authority issued in corresponding International Application No. PCT/US2021/018753, mailed on Aug. 11, 2021 (20 pages).

Colombo, Daniele et al., "Physics-driven deep learning joint inversion", SEG Technical Program Expanded Abstracts 2020, pp. 1775-1779, Sep. 30, 2020 (8 pages).

Moorkamp, Max et al., "Joint Inversion in Hydrocarbon Exploration: Theory and Applications", In: "Integrated Imaging of the Earth: Theory and Applications", John Wiley & Sons, Inc, vol. 218, pp. 167-189, Apr. 22, 2016 (23 pages).

Colombo et al.; "Coupled physics-deep learning inversion", Computers & Geosciences; vol. 157; Aug. 25, 2021; pp. 1-13 (13 pages).

He et al.; "Physics-informed neural networks for multiphysics data assimilation with application to subsurface transport", Advances in Water Resources; vol. 141; May 6, 2020; pp. 1-15 (15 pages).

Sun et al.; "Physics-guided deep learning for seismic inversion with hybrid training and uncertainty analysis", Geophysics; vol. 86; Issue 3; May 2021; pp. R303-R317 (15 pages).

Ray, A. and Myer, D.; "Bayesian geophysical inversion with transdimensional Gaussian process machine learning", Geophysical Journal International; vol. 217; Feb. 28, 2019; pp. 1706-1726 (21 pages).

Berger et al.; "A Survey of Active Learning for Quantifying Vegetation Traits from Terrestial Earth Obersvation Data", Remote Sensing; vol. 13; No. 2; 287; pp. 1-23 (23 pages).

Moss, Adam; "Accelerated Bayesian inference using deep learning", Monthly Notices of the Royal Astronomical Society; vol. 496; May 2020; pp. 1-12 (12 pages).

Jannouch, E. H. and Holmstedt, O.; "Deep-learning-accelerated Bayesian inference for state-space models", Master's thesis in Mathematics; Chalmers University of Technology; 2020 (91 pages).

Hooten et al.; "Making Recursive Bayesian Inference Accessible", The American Statistician; vol. 75; No. 2; Sep. 2019 (10 pages).

* cited by examiner

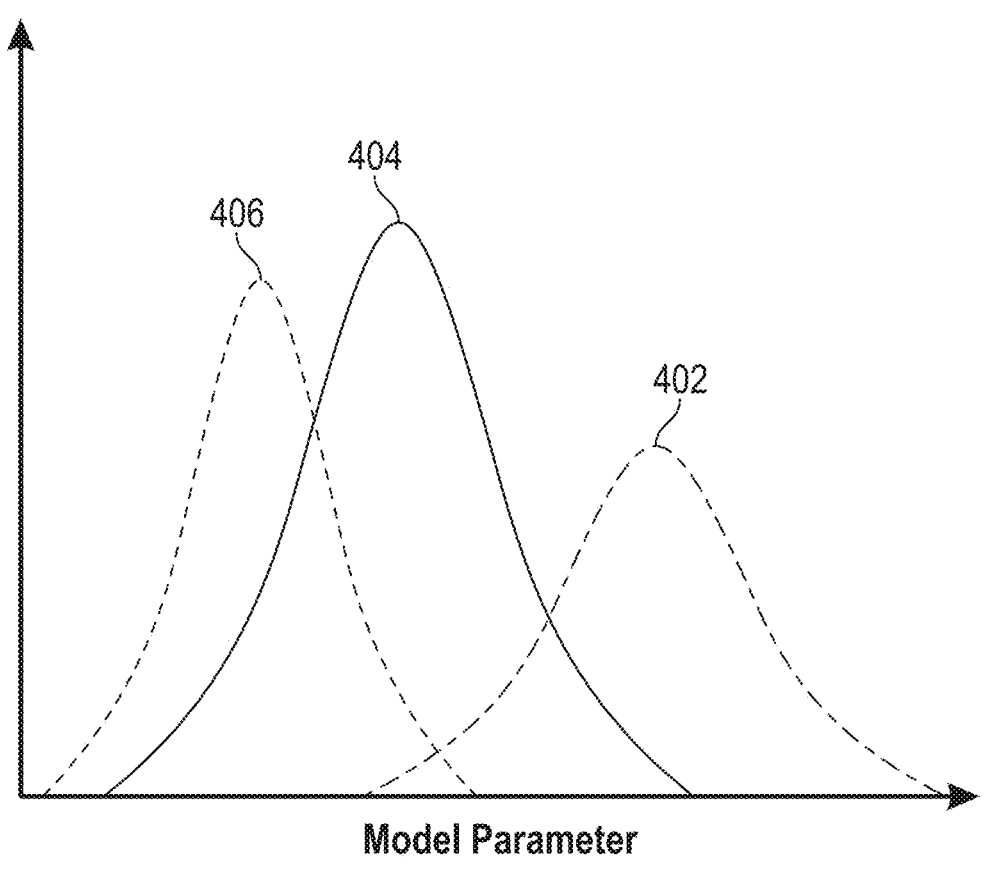
FIG. 4
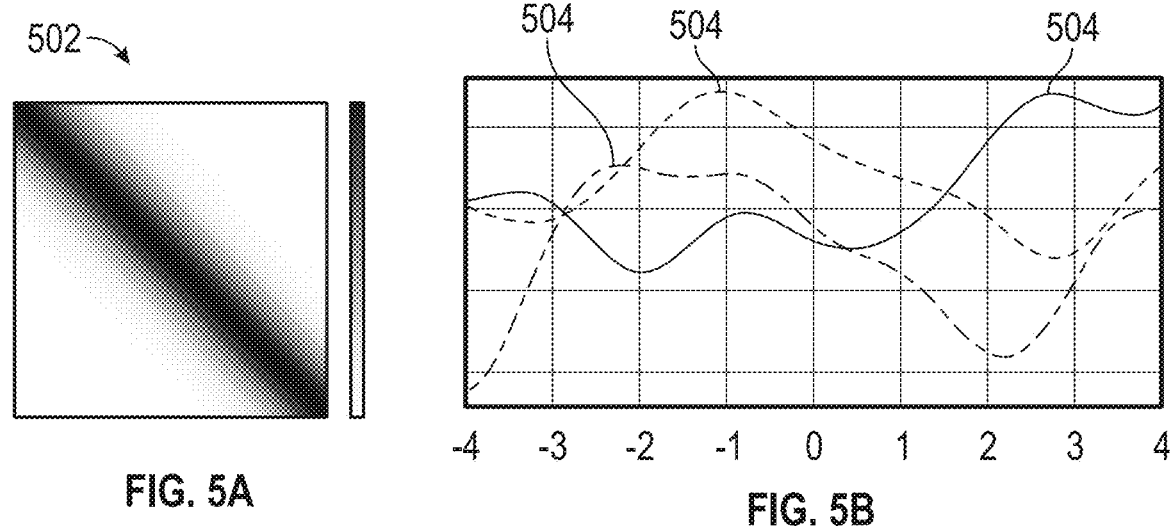
FIG. 5A
FIG. 5B

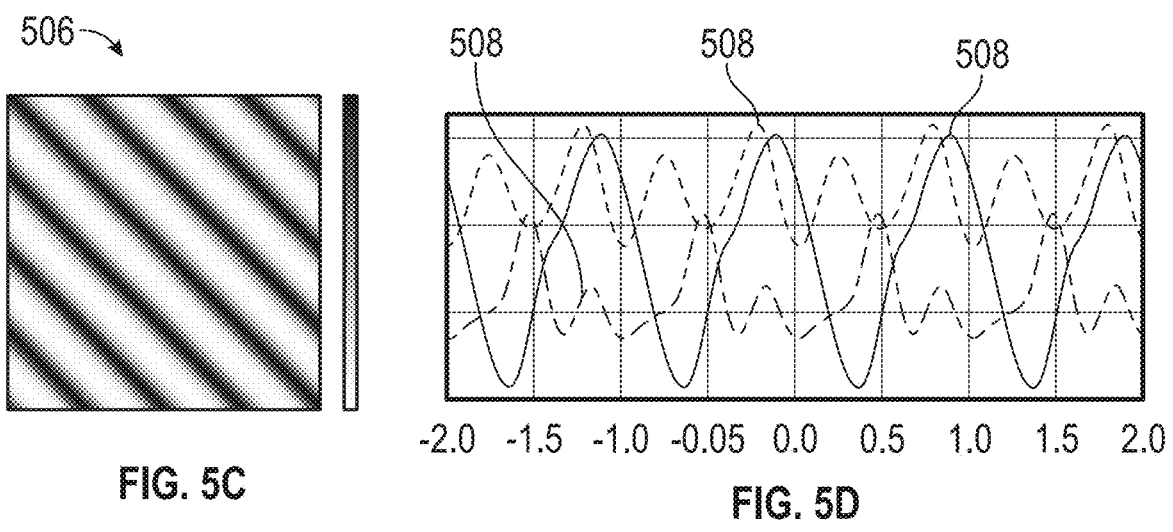
FIG. 5C
FIG. 5D
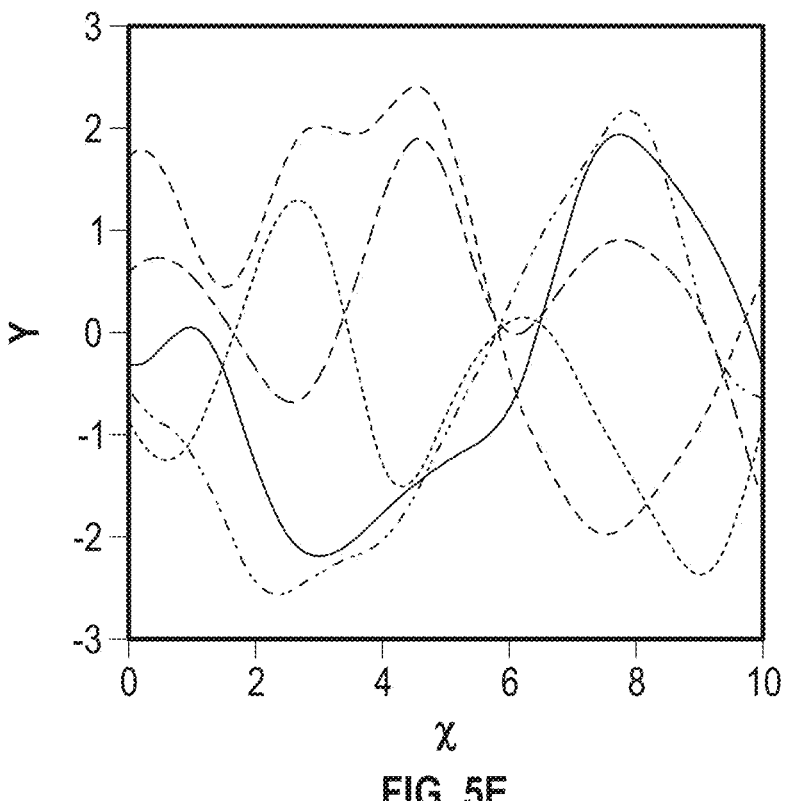
FIG. 5E

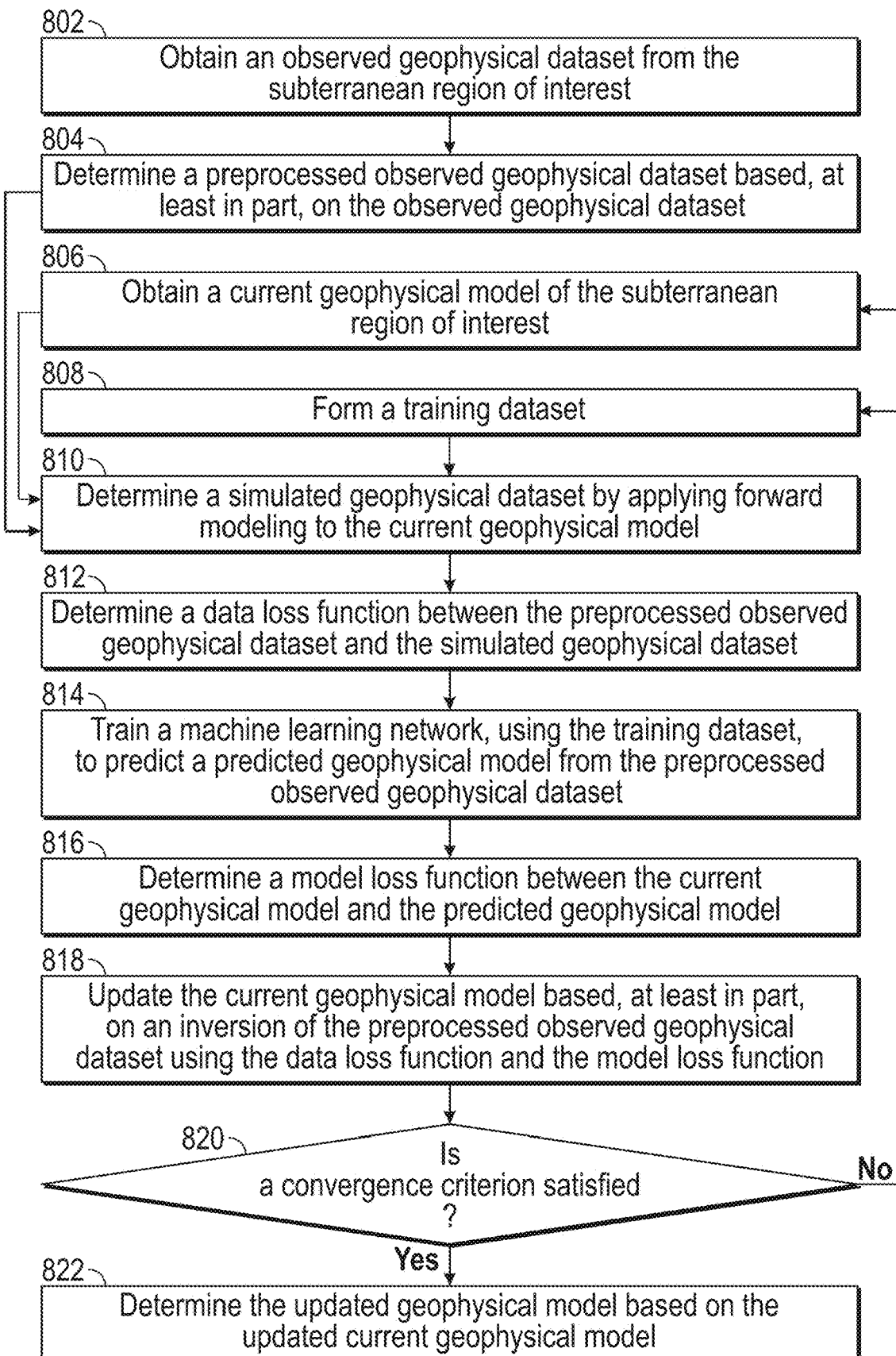

802 ─ Obtain an observed geophysical dataset from the subterranean region of interest 804 ─ Determine a preprocessed observed geophysical dataset based, at least in part, on the observed geophysical dataset 806 ─ Obtain a current geophysical model of the subterranean region of interest 808 ─ Form a training dataset 810 ─ Determine a simulated geophysical dataset by applying forward modeling to the current geophysical model 812 ─ Determine a data loss function between the preprocessed observed geophysical dataset and the simulated geophysical dataset 814 ─ Train a machine learning network, using the training dataset, to predict a predicted geophysical model from the preprocessed observed geophysical dataset 816 ─ Determine a model loss function between the current geophysical model and the predicted geophysical model 818 ─ Update the current geophysical model based, at least in part, on an inversion of the preprocessed observed geophysical dataset using the data loss function and the model loss function 820 ─ Is a convergence criterion satisfied ?        No Yes 822 ─ Determine the updated geophysical model based on the updated current geophysical model

FIG. 8

MACHINE LEARNING INVERSION USING BAYESIAN INFERENCE AND SAMPLING

BACKGROUND

In geophysical applications, inversion is used to determine a computerized representation of the physical properties of a subterranean region of interest from geophysical and geological measurements and their interpretation. Geophysical and geological measurements present as a geophysical dataset. Physical properties present as a geophysical model. Model parameters within a geophysical model may include density and resistivity, for example, as a function of spatial position within the subterranean region of interest. The geophysical model determined by inversion may be used, at least in part, to locate a hydrocarbon reservoir.

However, inversion may fail to fully utilize a geophysical dataset. As such, the geophysical model determined by inversion may fail to robustly represent the physical properties of the subterranean region of interest. In turn, interpretation of the geophysical model may not accurately identify a hydrocarbon reservoir.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to methods of determining an updated geophysical model of a subterranean region of interest. The method includes obtaining a preprocessed observed geophysical dataset based, at least in part, on an observed geophysical dataset of the subterranean region of interest, and forming a training dataset composed of a plurality of geophysical training models and corresponding simulated geophysical training datasets. The method further includes iteratively determining a simulated geophysical dataset from a current geophysical model, determining a data loss function between the preprocessed observed geophysical dataset and the simulated geophysical dataset, training a machine learning (ML) network, using the training dataset, to predict a predicted geophysical model and determining a model loss function between the current and predicted geophysical models. The method still further includes updating the current geophysical model based on an inversion using the data loss and model loss functions.

In general, in one aspect, embodiments relate to a non-transitory computer readable medium storing instructions executable by a computer processor. The instructions include functionality for determining a preprocessed observed geophysical dataset based, at least in part, on an observed geophysical dataset of the subterranean region of interest, and for forming a training dataset composed of a plurality of geophysical training models and corresponding simulated geophysical training datasets. The instructions further include iteratively determining a simulated geophysical dataset from a current geophysical model, determining a data loss function between the preprocessed observed geophysical dataset and the simulated geophysical dataset, training a machine learning (ML) network, using the training dataset, to predict a predicted geophysical model and determining a model loss function between the current and predicted geophysical models. The instructions still further include updating the current geophysical model based on an inversion using the data loss and model loss functions.

In general, in one aspect, embodiments relate to a system including a seismic acquisition system configured to obtain an observed geophysical dataset from a subterranean region of interest and a computer system configured to determine a preprocessed observed geophysical dataset based, at least in part, on an observed geophysical dataset of the subterranean region of interest, and to form a training dataset composed of a plurality of geophysical training models and corresponding simulated geophysical training datasets. The computer system is further configured to iteratively determine a simulated geophysical dataset from a current geophysical model, determine a data loss function between the preprocessed observed geophysical dataset and the simulated geophysical dataset, train a machine learning (ML) network, using the training dataset, to predict a predicted geophysical model and determine a model loss function between the current and predicted geophysical models. The computer system is still further configured to update the current geophysical model based on an inversion using the data loss and model loss functions.

Other aspects and advantages of the claimed subject matter will be apparent from the following description and the appended claims.

BRIEF DESCRIPTION OF DRAWINGS

FIG. 4 depicts Bayes' theorem in accordance with one or more embodiments.

FIG. 5A shows a kernel matrix in accordance with one or more embodiments.

FIG. 5B shows sampled functions in accordance with one or more embodiments.

FIG. 5C shows a kernel matrix in accordance with one or more embodiments.

FIG. 5D shows sampled functions in accordance with one or more embodiments.

FIG. 5E shows a prior in accordance with one or more embodiments.

FIG. 8 shows a flowchart in accordance with one or more embodiments.

DETAILED DESCRIPTION

Figure 1:
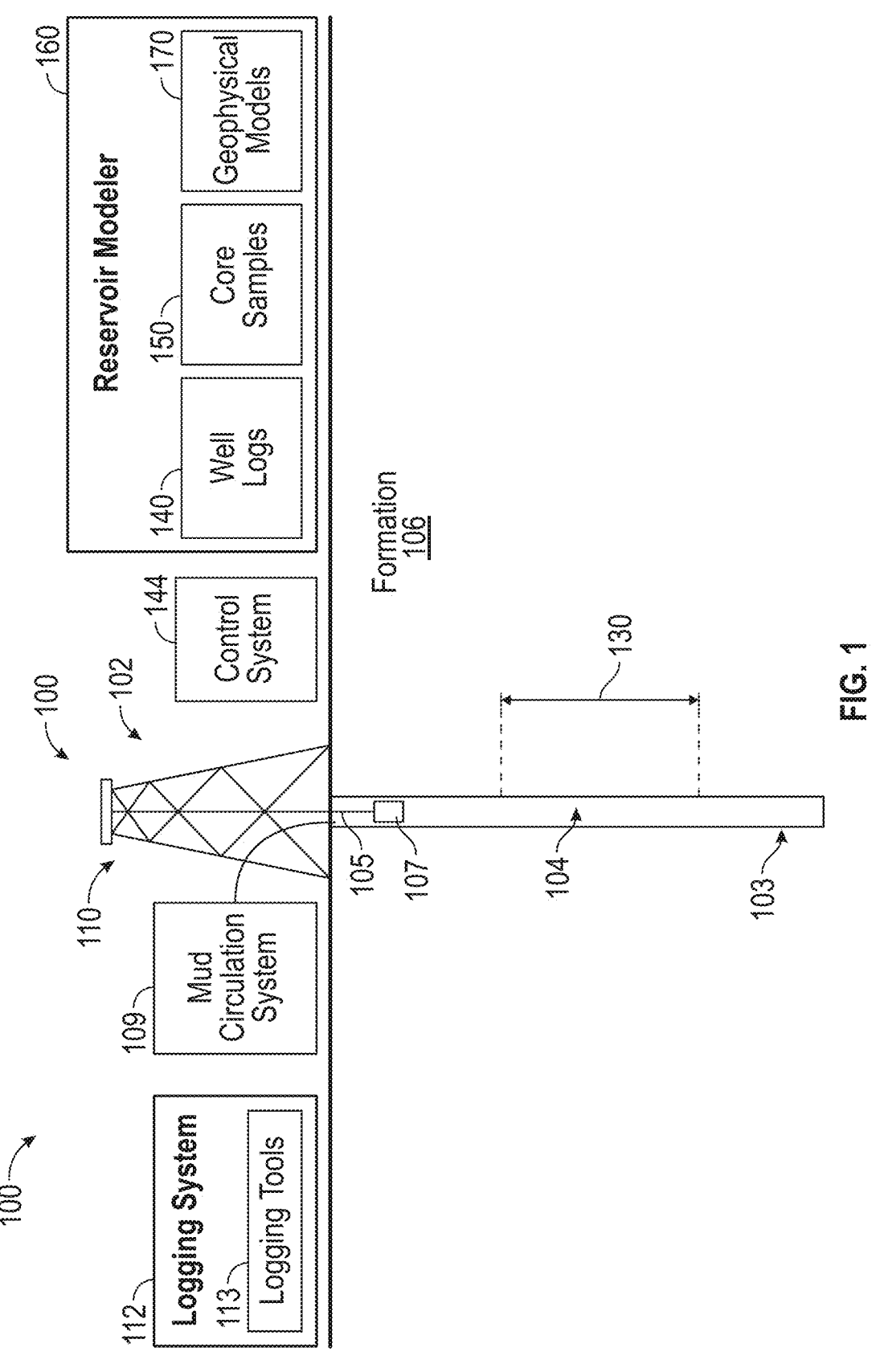
FIG. 1 shows a well environment according to one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-11 any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a model parameter" includes reference to one or more of such parameters.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

Embodiments disclosed provide a workflow for determining a geophysical model iteratively by applying inversion and a machine learning (ML) network to a geophysical dataset. Sampling, Bayesian inference, or both may be used within the workflow.

FIG. 1 illustrates a well environment (100) comprising a well (102) with a wall (103) having a wellbore (104) extending into a formation (106). The wellbore (104) comprises a bored hole that extends from the surface into a target zone of the formation (106), such as a hydrocarbon reservoir (not shown). The formation (106) comprises various geophysical formation properties of interest, such as formation porosity, formation permeability, resistivity, water saturation, and free water level (FWL). Hereinafter, "geophysical formation properties of interest" will be referred to as "model parameters" within a geophysical model. Porosity indicates how much void space exists in a particular rock within an area of interest in the formation (106), where oil, gas, or water is trapped. Permeability indicates the ability of liquids and gases that flow through the rock within the area of interest. Resistivity indicates how strongly rock or fluid within the formation (106) opposes the flow of electrical current. For example, resistivity indicates the porosity of the formation (106) and the presence of hydrocarbons. More specifically, resistivity is relatively low for a formation that has high porosity and a large amount of water, and resistivity is relatively high for a formation that has low porosity or comprises a large quantity of hydrocarbons. Water saturation indicates the fraction of water in a given pore space.

Keeping with FIG. 1, the well environment (100) comprises a drilling system (110), a logging system (112), a control system (144), and a reservoir modeler (160). The drilling system (110) comprises a drillstring (105), drill bit (107), and a mud circulation system (109) for use in boring the wellbore (104) into the formation (106). The control system (144) comprises hardware or software for managing drilling operations or maintenance operations. For example, the control system (144) may include one or more programmable logic controllers (PLCs) comprising hardware or software with functionality to control one or more processes performed by the drilling system (110). Specifically, a programmable logic controller may control valve states, fluid levels, pipe pressures, warning alarms, or pressure releases throughout a drilling rig. In accordance with some embodiments, the programmable logic controller may be a ruggedized computer system with functionality to withstand vibrations, extreme temperatures (for example, ~575° C.), wet conditions, or dusty conditions, for example, around a drilling rig. The term "control system" refers broadly to systems that effect control including, for example and without limitation, a drilling operation control system that is used to operate and control the equipment, a drilling data acquisition and monitoring system that is used to acquire drilling process and equipment data and to monitor the operation of the drilling process, and/or a drilling interpretation software system that is used to analyze and understand drilling events and progress.

The logging system (112) includes one or more logging tools (113). The logging tools (113) may be any type of logging tool (113) known in the art, such as a nuclear magnetic resonance (NMR) logging tool or a resistivity logging tool, for use in generating well logs (140) of the formation (106). For example, a logging tool (113) may be lowered into the wellbore (104) to acquire measurements as the tool traverses a depth interval (130) (for example, a targeted hydrocarbon reservoir section) of the wellbore (104). Alternatively, the logging tool (113) may be incorporated into the drillstring (105). The plot of the logging measurements versus depth refers to a "log" or "well log". Well logs (140) provide depth measurements of the wellbore (104) that describe model parameters within a geophysical model. The resulting logging measurements are stored or processed or both, for example, by the control system (144) to generate corresponding well logs (140) for the well (102). A well log (140) comprises a plot of a logging response time versus true vertical depth (TVD) across the depth interval (130) of the wellbore (104).

Model parameters of a geophysical model are determined using a variety of different techniques. For example, certain model parameters may be determined via coring (for example, physical extraction of rock samples) to produce core samples (150). Alternatively, or additionally, model parameters may be determined by logging operations (for example, wireline logging, logging-while-drilling (LWD) and measurement-while-drilling (MWD)). Coring operations comprise physically extracting a rock sample from a region of interest within the wellbore (104) for detailed laboratory analysis. For example, when drilling an oil or gas well (102), a coring bit cuts plugs (or "cores") from the formation (106) and brings the plugs to the surface. These core samples are then analyzed at the surface to determine various model parameters of the formation (106) at the location where the sample was obtained. One example of a model parameter is the amount of oil present in the hydrocarbon reservoir. Another is the permeability of the hydrocarbon reservoir rock.

Multiple types of logging techniques are available for determining various model parameters. For a particular application, one or more forms of logging may be selected and used based on the logging conditions and the type of desired measurements. For example, NMR logging measures the induced magnetic moment of hydrogen nuclei (that is, protons) contained within the fluid-filled pore space of porous media (for example, hydrocarbon reservoir rocks). Thus, NMR logs measure the magnetic response of fluids present in the pore spaces of the hydrocarbon reservoir rocks. In doing so, NMR logs measure both porosity and permeability as well as the types of fluids present in the pore spaces. For determining permeability, another type of logging is used called spontaneous potential (SP) logging. SP logging determines the permeabilities of rocks in the formation (106) by measuring the amount of electrical current generated between a drilling fluid produced by the drilling system (110) and formation water that is present in pore spaces of the hydrocarbon reservoir rock. Porous sandstones with high permeabilities generate more electricity than impermeable shales. Thus, SP logs are used to identify sandstones from shales.

To determine porosity in the formation (106), various types of logging techniques are used. For example, the logging system (112) may measure the speed at which acoustic waves travel through rocks in the formation (106). This type of logging generates borehole compensated (BHC) logs, which are also called sonic logs and acoustic logs. Sound waves travel faster through shales than through sandstones because shales have greater density than sandstones. Likewise, density logging also determines porosity by directly measuring the density of the rocks in the formation (106). In addition, neutron logging determines porosity by assuming that the hydrocarbon reservoir pore spaces within the formation (106) are filled with either water or oil and then measures the amount of hydrogen atoms (that is, neutrons) in the pores. Furthermore, the logging system (112) may determine geological data for the well (102) by measuring corresponding well logs (140) and data regarding core samples (150) for the well (102).

Keeping with the various types of logging techniques, resistivity logging measures the model parameter of electrical resistivity of rock or sediment in and around the wellbore (104). In particular, resistivity measurements may determine what types of fluids are present in the formation (106) by measuring how effective these rocks are at conducting electricity. Fresh water and oil are both poor conductors of electricity, thus they have high relative resistivities. For example, an electrical resistivity of crude oil ranges from $4.0 \times 10^6$ to $1.5 \times 10^8$ ohm-meter and the electrical resistivity of fresh water is in the range of 10-100 ohm-meter. However, in hydrocarbon reservoirs, pores are seldom filled with pure water or pure crude oil and the resistivity contrasts are much smaller. For example, in mainly water-filled formations the resistivity values may lie in the range of 0.2-10 ohm-meter, while in mainly oil-filled formations, the resistivity values may lie in the range of 20-2000 ohm-meters. As such, resistivity measurements obtained via such logging may be used to determine corresponding hydrocarbon reservoir water saturation.

Turning to the reservoir modeler (160), the reservoir modeler (160) comprises hardware and software with functionality for generating one or more geophysical models (170) regarding the formation (106). For example, the reservoir modeler (160) may store (or receive) well logs (140) and data regarding core samples (150), and further analyze the well log data, the core sample data or other types of data to generate or update the model parameters of the one or more geophysical models (170). The reservoir modeler (160) may couple to the logging system (112) and the drilling system (110).

In some embodiments, the reservoir modeler (160) is implemented in a software platform for the control system (144). The software platform obtains data acquired by the drilling system (110) and logging system (112) as inputs, which comprise multiple data types from multiple sources. The software platform aggregates the data from these systems (110, 112) in real-time for rapid analysis.

Figure 2:
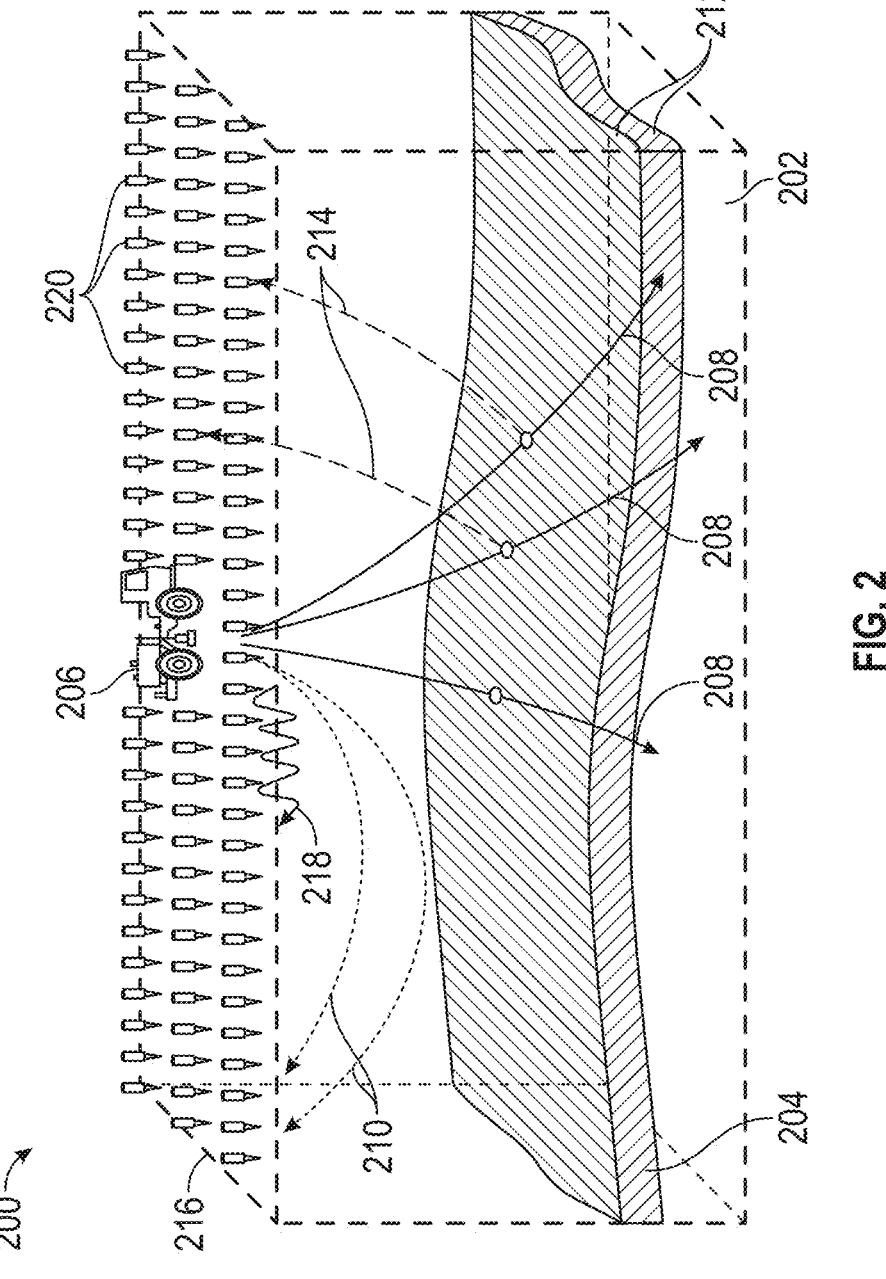
FIG. 2 depicts a seismic survey in accordance with one or more embodiments.

FIG. 2 shows a seismic survey (200) of a subterranean region of interest (202), which may contain a hydrocarbon reservoir (204). The seismic survey (200) may utilize a seismic source (206) that generates radiated seismic waves (208). In a land environment, the seismic source (206) may be a dynamite source or one or more seismic vibrators ("vibroseis truck"). In a marine or lacustrine environment, the seismic source (206) may be an air gun. The radiated seismic waves may be recorded by a plurality of seismic receivers (220). A single activation of the seismic source (206) may be recorded by tens or hundreds of thousands of seismic receivers (220). In a land environment, the seismic receiver (220) may record the velocity or acceleration of ground-motion. In a marine or lacustrine environment, the seismic receiver (220) may record pressure fluctuations caused by the radiated seismic waves (208).

The radiated seismic waves (208) may propagate along the ground surface as surface waves ("ground-roll") (218), or the radiated seismic waves (208) may propagate below the surface and return as refracted seismic waves (210) or may be reflected one or more times by geological discontinuities (212) and return to the surface as reflected seismic waves (214).

The refracted seismic waves (210) and reflected seismic waves (214) generated by a single activation of the seismic source (206) are recorded by a seismic receiver (220) as a time-series representing the amplitude of ground-motion at a sequence of discrete times. This time-series may be denoted a seismic "trace". A seismic source (206) is positioned at a location denoted $(x_s, y_s)$ where x and y represent orthogonal axes on the surface of the Earth above the subterranean region of interest (202). The seismic receivers (220) are positioned at a plurality of seismic receiver locations denoted $(x_r, y_r)$. Thus, the refracted seismic waves (210) and reflected seismic waves (214) generated by a single activation of the seismic source (206) may be represented as a five-dimensional seismic dataset by $(x_s, y_s, x_r, y_r,$ t) where t delimits the time sample at which the amplitude of ground-motion was measured by a seismic receiver (220). The seismic dataset described is one type of observed geophysical dataset. Other types of observed geophysical datasets include a gravity dataset, an active source resistivity dataset, a magneto-telluric dataset, or any combination of these datasets.

An observed geophysical dataset is preprocessed to produce valuable information. Typically, preprocessing consists of applying noise reduction techniques, filtering, and smoothing. Hereinafter, an observed geophysical dataset that is preprocessed is denoted a "preprocessed observed geophysical dataset".

Machine learning may be used to predict a geophysical model from a preprocessed observed geophysical dataset. Machine learning, broadly defined, is the extraction of patterns and insights from data. The phrases "artificial intelligence", "machine learning", "deep learning", and "pattern recognition" are often convoluted, interchanged, and used synonymously throughout the literature. This ambiguity arises because the field of "extracting patterns and insights from data" was developed simultaneously and disjointedly among a number of classical arts like mathematics, statistics, and computer science. For consistency, the term machine learning, or machine-learned, will be adopted herein, however, one skilled in the art will recognize that the concepts and methods detailed hereafter are not limited by this choice of nomenclature.

Machine-learned model types may include, but are not limited to, neural networks, random forests, generalized linear models, Bayesian methods, and stochastic processes (e.g. Gaussian process regression). Machine-learned model types are usually associated with additional "hyperparameters" which further describe the model. For example, hyperparameters providing further detail about a neural network may include, but are not limited to, the number of layers in the neural network, choice of activation functions, inclusion of batch normalization layers, and regularization strength. The selection of hyperparameters surrounding a model is referred to as selecting the model "architecture". Generally, multiple model types and associated hyperparameters are tested and the model type and hyperparameters that yield the greatest predictive performance on a hold-out set of data is selected.

Figure 3:
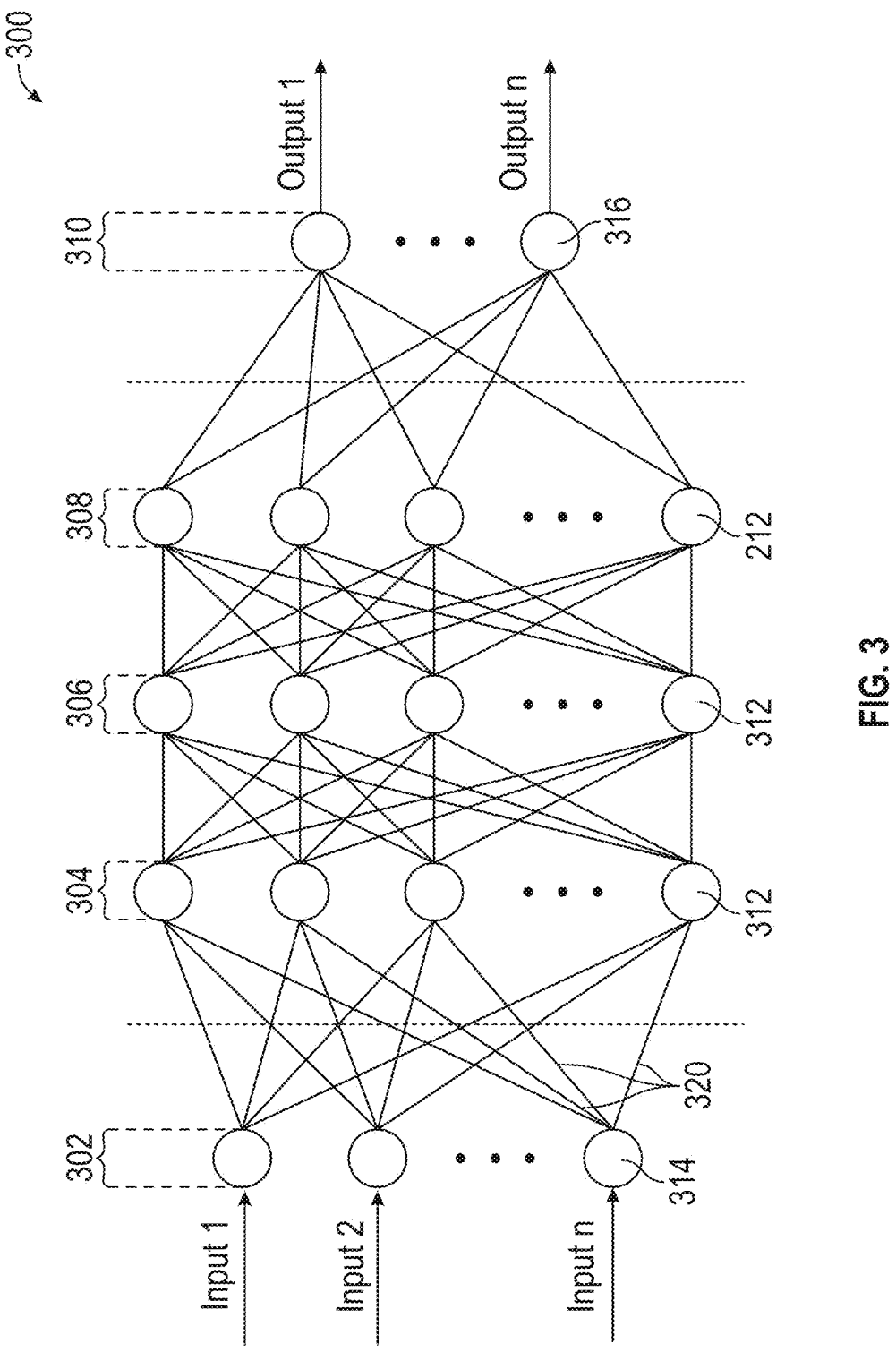
FIG. 3 shows a neural network in accordance with one or more embodiments.

FIG. 3 illustrates a neural network (300) in accordance with one or more embodiments. A neural network (300) uses a series of mathematical functions to make predictions based on observations. A neural network (300) may include an input layer (302), hidden layers, such as a first hidden layer (304), a second hidden layer (306), a third hidden layer (308), and an output layer (310). Each layer represents a vector where each element within each vector is represented by an artificial neuron, such as artificial neurons (312) (hereinafter also "neuron"). A neuron is loosely based on a biological neuron of the human brain. The input layer (302) may receive an observed data vector x where each neuron, such as neuron (314), within the input layer (302) receives one element $x_i$ within x. Each element is a value that represents a datum that is observed. The vector x may be called "input data" and, in some embodiments, may be a preprocessed observed geophysical dataset. FIG. 3 displays the input data or vector x as elements $x_1, x_2, x_i \ldots x_n$, where $x_1$ may be a value that represents a trace of a first receiver (220), $x_2$ may be a value that represents a measured value of gravity at a first spatial position, etc.

The output layer (310) may represent the vector y where each neuron, such as neuron (316), within the output layer (310) represents each element $y_j$ within y. The vector y may be called "output data" and, in some embodiments, may be a geophysical model. FIG. 3 displays the output data or vector y with m elements, where an element $y_j$ may be a value that represents resistivity at a spatial location within a subterranean region of interest (202). For example, $y_1$ and $y_2$ may represent density at a first spatial location and at a second spatial location, respectively, within the subterranean region of interest (202). In this embodiment, the neural network (300) may solve a regression problem where all outputs $y_m$ may depend on a temporal or spatial position.

Neurons in the input layer (302) may be connected to neurons in the first hidden layer (304) through connections, such as connections (320). A connection (320) may be analogous to a synapse of the human brain and may have a weight associated to it. The weights for all connections (320) between the input layer (302) and the first hidden layer (304) make up a first array of weights w, with elements $w_{ik}$:

$$w = \begin{bmatrix} w_{11} & w_{12} & w_{1k} & w_{1L} \\ w_{21} & w_{22} & w_{2k} & w_{2L} \\ w_{i1} & w_{i2} & w_{ik} & w_{iL} \\ w_{n1} & w_{n2} & w_{nk} & w_{nL} \end{bmatrix}, \qquad \text{Equation (1)}$$

where k indicates a neuron in the hidden first hidden layer and L is the total number of neurons in the first hidden layer for the embodiment shown in FIG. 3. The elements in each column are the weights associated with the connections (320) between each of the n elements in vector x that propagate to the same neuron k (312) in the first hidden layer (304). The value of a neuron k, $a_k$, in the first hidden layer may be computed as $$a_k = g_k\left(b_k + \sum_i x_i w_{ik}\right), \qquad \text{Equation (2)}$$

where, in addition to the elements of the input vector x and the first array of weights w, elements from a vector b, which has a length of L, and an activation function $g_k$ are referenced. The vector b represents a bias vector and its elements may be referred to as biases. In some implementations, the biases may be incorporated into the first array of weights such that Equation (2) may be written as $a_k = g_k(\Sigma_i x_i w_{ik})$.

Each weight $w_{ik}$ within the first array of weights may amplify or reduce the significance of each element within vector x. Some activation functions may include the linear function g(x)=x, sigmoid function $$g(x) = \frac{1}{1 + e^{-x}},$$

and rectified linear unit function g(x)=max(0, x), however, many additional functions are commonly employed. Every neuron in a neural network may have a different associated activation function. Often, as a shorthand, activation functions are described by the function $g_k$ by which it is composed. That is, an activation function composed of a linear function may simply be referred to as a linear activation function without undue ambiguity.

Similarly, the weights for all connections (320) between the first hidden layer (304) and the second hidden layer (306) make up a second array of weights. The second array of weights will have L rows, one for each neuron in the first hidden layer, and a number of columns equal to the number of neurons in the second hidden layer. Likewise, a second bias vector and second activation functions may be defined to relate the first hidden layer to the second hidden layer. The values of the neurons for the second hidden layer are likewise determined using Equation (2) as before, but with the second array of weights, second bias vector, and second activation functions. This process of determining the values for a hidden layer based on the values of the neurons of the previous layer and associated array of weights, bias vector, and activation functions is repeated for all layers in the neural network. As stated above, the number of layers in a neural network is a hyperparameter of the neural network (300). It is noted that FIG. 3 depicts a simple and general neural network (300). In some embodiments, the neural network (300) may contain specialized layers, such as a normalization layer, or additional connection procedures, like concatenation. One skilled in the art will appreciate that these alterations do not exceed the scope of this disclosure.

For a neural network (300) to complete a "task" of predicting an output from an input, the neural network (300) must first be trained. Training may be defined as the process of determining the values of all the weights and biases for each weight array and bias vector encompassed by the neural network (300).

To begin training the weights and biases are assigned initial values. These values may be assigned randomly, assigned according to a prescribed distribution, assigned manually, or by some other assignment mechanism. Once the weights and biases have been initialized, the neural network (300) may act as a function, such that it may receive inputs and produce an output. As such, at least one input is propagated through the neural network (300) to produce an output. A training dataset is composed of inputs and associated target(s), where the target(s) represent the "ground truth", or the otherwise desired output. That is, the training dataset may be a plurality of input data and a plurality of output data either of which are observed or simulated. The neural network (300) output is compared to the associated input data target(s). The comparison of the neural network (300) output to the target(s) is typically performed by a so-called "loss function"; although other names for this comparison function such as "error function", "objective function", "misfit function", and "cost function" are commonly employed. Many types of loss functions are available, such as the mean-squared-error function, however, the general characteristic of a loss function is that the loss function provides a numerical evaluation of the similarity between the neural network (300) output and the associated target(s). The loss function may also be constructed to impose additional constraints on the values assumed by the weights and biases, for example, by adding a penalty term, which may be physics-based, or a regularization term. Generally, the goal of a training procedure is to alter the weights and biases to promote similarity between the neural network (300) output and associated target(s) over the training dataset. Thus, the loss function is used to guide changes made to the weights and biases, typically through a process called "backpropagation".

While a full review of the backpropagation process exceeds the scope of this disclosure, a brief summary is provided. Backpropagation consists of computing the gradient of the loss function over the weights and biases. The gradient indicates the direction of change in the weights and biases that results in the greatest change to the loss function. Because the gradient is local to the current weights and biases, the weights and biases are typically updated by a "step" in the direction indicated by the gradient. The step size is often referred to as the "learning rate" and need not remain fixed during the training process. Additionally, the step size and direction may be informed by previously seen weights and biases or previously computed gradients. Such methods for determining the step direction are usually referred to as "momentum" based methods.

Once the weights and biases have been updated, or altered from their initial values, through a backpropagation step, the neural network (300) will likely produce different outputs. Thus, the procedure of propagating at least one input through the neural network (300), comparing the neural network (300) output with the associated target(s) with a loss function, computing the gradient of the loss function with respect to the weights and biases, and updating the weights and biases with a step guided by the gradient, is repeated until a termination criterion is reached. Common termination criteria are: reaching a fixed number of updates, otherwise known as an iteration counter; a diminishing learning rate; noting no appreciable change in the loss function between iterations; reaching a specified performance metric as evaluated on the data or a separate hold-out dataset. Once the termination criterion is satisfied, and the weights and biases are no longer intended to be altered, the neural network (300) is said to be "trained".

Following training, the neural network (300) may perform a task to predict unknown output data from input data. If additional input data and corresponding output data become available that augment the training dataset, the neural network (300) may be re-trained. Re-training may encompass re-initializing the weights and biases and repeating the backpropagation process using the augmented training dataset. Alternatively, re-training may use a transfer learning approach where a subset of the weights and biases are fixed and the remaining weights and biases are updated using the augmented training dataset.

Processes such as forward modeling, inversion, and machine learning may be performed within the theoretical framework of Bayesian statistics, which is based on Bayes' theorem. In the context of this disclosure, Bayesian statistics defines a model parameter within a geophysical model as a degree of belief where B ayes' theorem quantifies the degree of belief using a probability distribution (PD). The PD may be continuous-valued, discrete-valued, or a combination of discrete and continuous. In accordance with one or more embodiments, the PD may be represented as a probability mass function (PMF) or a probability density function (PDF). Hereinafter, "degree of belief" and "PD" will be considered synonymous and used interchangeably. Bayes' theorem may be used to update a previous degree of belief as more evidence or information becomes available. By way of example, FIG. 4 depicts Bayes' theorem pictorially, in accordance with one or more embodiments. The previous degree of belief is referred to as a "prior" (402) denoted P(A). The prior P(A) (402) may be based on a prior assumption A or a previous "posterior". A posterior (404), denoted P(A|B), is the degree of belief of A taking new evidence B into account. Bayes' theorem updates a prior P(A) (402) to a posterior P(A|B) (404) based on the new evidence B such that:

$$P(A \mid B) = \frac{P(B \mid A) \cdot P(A)}{P(B)},$$
Equation (3)

where P(B) is the degree of belief of the new evidence B or marginal and P(B|A) is a likelihood function (406). The law of total probability may be used to calculate P(B). P(B) may also be omitted, such as in cases where P(B) is difficult to calculate, such that:

$$P(A \mid B) \propto P(B \mid A) \cdot P(A).$$ Equation (4)

The likelihood function P(B|A) (406) is a probability of B given A. In other words, the likelihood function P(B|A) (406) describes how likely the new evidence B is assuming A is true. The likelihood function, thus, shifts the degree of belief of A closer to the true or actual degree of belief of A.

Bayes' theorem may be used to update a PD of a model parameter within a geophysical model to shift the degree of belief of the model parameter closer to the true degree of belief iteratively. New evidence B is available for each iteration and the posterior P(A|B) (404) of the previous iteration k−1 becomes the prior P(A) (402) for the current iteration k such that:

$$P(A_k \mid B_k) \propto P(B_k \mid A_k) \cdot P(A_{k-1} \mid B_{k-1}).$$ Equation (5)

This idea is known as Bayesian inference. Specifically, Bayesian inference is a method of statistical inference in which Bayes' theorem is used to update assumption A.

While Bayesian inference may be directly applied to update the PD of a model parameter, probability distribution sampling methods may also be implemented. One reason to implement probability distribution sampling methods is to reduce computational cost. One class of probability distribution sampling methods is the Markov chain Monte Carlo (MCMC) methods. In the context of this disclosure, MCMC methods may be used to generate sampled posteriors of model parameters. As the number of samples increases, the sampled posterior (404) approaches the true posterior determined by Bayes' theorem. MCMC methods generate sampled posteriors (404) by first constructing Markov chains. A Markov chain or Markov process is a stochastic model that describes a sequence of possible events where each transition from one event to another depends on a transition probability. One framework for constructing a Markov chain is the Metropolis-Hastings framework. Various algorithms that build upon the Metropolis-Hastings framework include, without limitation, Gi3s sampling, Metropolis-adjusted Langevin algorithm, Pseudo-marginal Metropolis-Hastings, and reversible-jump. Algorithms outside of the Metropolis-Hastings framework include, without limitation, slices sampling and Hamiltonian Monte Carlo. Once a Markov chain is constructed, a sampled posterior (404) is determined from the Markov chain by selecting random states of the chain using Monte Carlo sampling methods. Alternative to MCMC methods, variational inference methods may be used as probability distribution sampling methods. In brief, variational inference methods treat sampling the PD of a model parameter as an optimization problem of approximating the posterior (404).

Yet another model, which may be considered a machine-learned model, is a stochastic process (SP). A SP is a collection of random variables (RVs). In general, a RV is a mathematical object. An RV may comprise a function, or a rule set, which maps an event to a numeric value. Different events, and therefore the associated numeric values, may be observed with different frequencies. As such, a RV often further comprises a PD representing the relative probabilities of observing an event. Depending on the properties and inter-relationships between the random variables, a stochastic process (SP) may be further defined. For example, if a finite collection of random variables may be jointly represented as a multi-variate Gaussian, the stochastic process (SP) is a Gaussian process (GP).

Each RV in a stochastic process (SP) is associated with a spatial location, temporal location, or both a spatial and temporal location. As such, a SP may be considered a collection of PDs, where each PD has a known location in space, time, or both space and time. To be concrete, consider a 1-dimensional spatial system with an "x-axis". That is, a spatial location is specified with an x-value. Without loss of generality, $x_1, x_2, x_3, \ldots, x_n$ may represent various locations along the x-axis. An SP may define a RV, and associated PD, at each location $x_1, x_2, x_3, \ldots, x_n$. The random variables (RVs) encompassed by a SP may be covariant.

One with ordinary skill in the art will appreciate that there are multiple ways to interpret and understand a stochastic process (SP). One such viewpoint is to consider a SP as defining a PD over a space of functions, often referred to as the "function-space view". Like the Bayesian framework previously described, a stochastic process (SP) possesses the concept of a "prior". In the Bayesian framework, the prior (402) indicates a degree of belief about an object A, such as a random variable (RV), which may be a model parameter. The Bayesian prior (402), as shown in FIG. 4, may be depicted as a PD. Because A has a PD, specific values of A may be "sampled" from the Bayesian prior (402). After observing data, or evidence, the Bayesian prior (402), could be "updated" through the application of Bayes' theorem in Equation (5) to form a new PD over A known as the posterior. Like the prior, the posterior could be used to sample specific values of A. The prior of a stochastic process (SP) defines a PD over the function space before observing any data or evidence. Once data, or evidence, has been observed, an SP is "conditioned" such that the PD over function space is congruent with the observed data. The conditioned, or updated, PD over function space could be considered a posterior. Because the posterior of a SP is a PD over a function space, sampling the PD returns a function. Functions sampled from the posterior of a SP will satisfy any constraints imposed by the observed data. In order to specify a PD over the function space, additional information must be provided to a stochastic process (SP). As an example, for a Gaussian process (GP), the PD over function space is specified with a "mean function" and a "kernel". The mean function specifies the mean value of each random variable (RV) in the collection encompassed by the GP. Recall, that each RV in an SP, such as a GP, has an associated location—spatial, temporal, or both. As such, the mean function indicates the "expected" observed value at that location. Here, "expected" refers the expectation operator, where for a given continuous random variable X over a domain x with a probability density function p(x), the expectation is $$E[X] = \int_{-\infty}^{+\infty} x p(x).$$

The kernel of a Gaussian process (GP) indicates inter-relationships (i.e. covariances), if any, and their strength, between the RVs of the GP. GP kernels may be described by kernel functions. That is, a kernel function may accept any pair of RVs within the collection of the GP and return their covariance. As is often done in the literature, kernel functions may simply be referred to as kernels without undue ambiguity. Common GP kernels include, but are not limited to: white noise kernel; exponentiated quadratic kernel (also known as the squared exponential kernel, Gaussian kernel, or radial basis functions); rational quadratic kernel; and the periodic kernel. One with ordinary skill in the art will recognize that GP kernels may be formed specific to the context of the application, or GP kernels may be constructed from pre-defined kernels according to valid mathematical operations, such that those enumerated herein do not impose a limitation on the present disclosure. When a kernel function is used to determine covariances of a finite collection of random variables (RVs), the kernel may be considered a matrix. In order to be a valid GP kernel, the kernel matrix must be positive definite.

GP kernels often include hyperparameters such as a "length scale". Additional hyperparameters may be associated with a GP. The combination of a selected GP kernel, a mean function, and any associated hyperparameters, define the PD over the function space. As such, the GP kernel, mean function, and hyperparameters, indicate the behavior of functions that may be sampled from the function space. For example, when using a periodic kernel, only periodic functions are sampled from the function space. Further, the hyperparameters of a periodic kernel may specify the expected period length, or frequency, of any sampled function.

As an example, FIG. 5A depicts an exemplary kernel matrix and FIG. 5B depicts associated functions sampled from the function space, wherein a PD is defined over the function space. Similarly, FIG. 5C depicts another exemplary kernel matrix and FIG. 5D depicts associated functions sampled from the function space. For both cases shown in FIG. 5A-D, the mean function is zero for all values. Again, with a mean function and kernel matrix, a PD over the function space is defined. As such, functions may be sampled from the function space.

FIG. 5A shows the case where the kernel is a squared exponential kernel. The kernel and mean function are defined for a single spatial variable x with a domain of [−4,4] as shown in FIG. 5B. The squared exponential kernel is represented over this domain as a squared exponential kernel matrix (502). The squared exponential kernel matrix (502) indicates the covariance between RVs of the GP according to the spatial location of the RVs. As seen by the squared exponential kernel matrix (502), the covariance between RVs is a function of their spatial proximity. Specifically, covariance between RVs decreases with increasing spatial distance between RVs. Because, the mean function and kernel function are defined for a single spatial variable, x, any sampled functions from the associated PD of the GP will be a univariate function of the form y=f(x), where the domain of x is valid over the interval [−4,4]. Specifically, FIG. 5B shows three sampled functions (504) from the function space according to the associated PD over this space. Because the squared exponential kernel indicates greater covariance according to proximity, proximate spatial locations of x have similar values y. As a result, the sampled functions (504) are usually continuous and smooth-varying.

FIG. 5C depicts the case where the GP kernel is a periodic kernel for a single spatial variable x with a domain of [−2,2]. The periodic kernel is represented over this domain as a periodic kernel matrix (506). The periodic kernel matrix (506) indicates the covariance between RVs of the GP according to the spatial location of the RVs. As seen by the periodic kernel matrix (506), the covariance between RVs is a periodic function of their spatial distance. Like before, any sampled functions from the PD of this GP will be univariate with the form y=f(x) and valid over a domain of x [−2,2]. FIG. 5D shows three periodic functions (508) sampled from the function space according to the associated PD over this space. As can be seen, the sampled periodic functions (508) demonstrate periodicity in accordance with the periodic kernel.

Figure 5F:
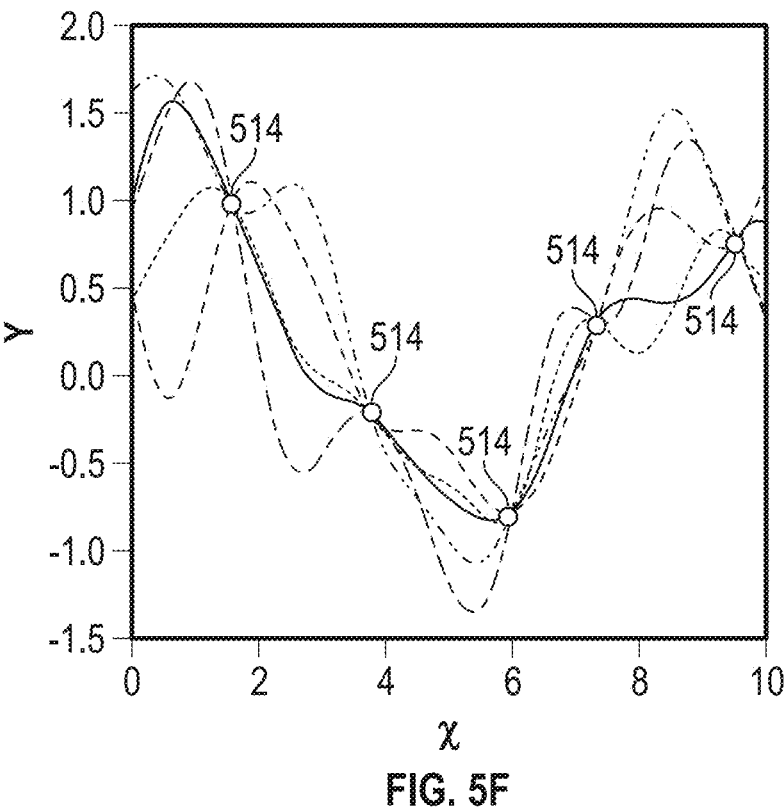
FIG. 5F shows a posterior in accordance with one or more embodiments.
Figure 5G:
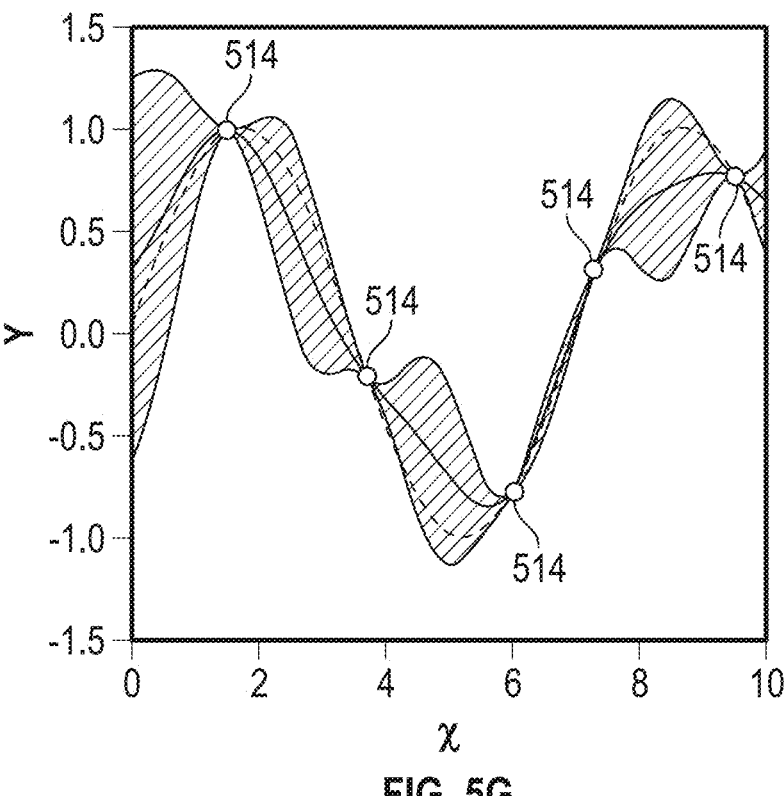
FIG. 5G depicts a probabilistic function in accordance with one or more embodiments.

FIGS. 5E-5G depict an example application of a Gaussian process (GP) called Gaussian process regression. This case considers a single spatial variable x over a domain of [0,10]. As before, any functions sampled from the GP will be univariate with the form y=f(x). For brevity, the mean function, kernel, and hyperparameters of this GP are not discussed in detail. However, the mean function is the zero function, f(x)=0, and the kernel is the squared exponential kernel. With a mean function and kernel defined, functions may be sampled from the GP. A set of functions sampled from the function space are shown in FIG. 5E. Because no data, or evidence, has been observed, the PD of the GP may be considered a "prior" PD and the sampled functions may be considered "prior functions". Data, or evidence, may be observed. The data are composed of x and y value pairs. In the current example, five x, y pairs were observed. These data (514) are plotted in FIG. 5F. As previously stated, once data, or evidence, has been observed, the PD over the function space may be conditioned on the observed data. Conditioning the PD on the observed data may be computationally intense and/or may include the use, or exploitation, of mathematical properties of the Gaussian process. As such, a detailed description is not provided here for brevity, however, one with ordinary skill int the art will recognize that this omission is non-limiting on the present disclosure. The conditioned PD may be considered a "posterior" PD. The posterior PD may be sampled to obtain "posterior functions" which are congruent with the observed data. As seen, the posterior functions sampled from the posterior PD all demonstrate agreement with the observed data (514).

As previously stated, a Gaussian process is a SP where any finite number of the random variables may be jointly represented as a multi-variate Gaussian. An important property of the multi-variate Gaussian is that after it has been conditioned, the resulting PD is still a multi-variate Gaussian. Additionally, the mean and variance of any individual RV may be extracted. As such, as a final step, the posterior PD of the GP may be used to determine the mean and variance of all associated RVs. Because the RVs are associated with a location (spatial in the present example), the RVs form, and may be plotted as, a probabilistic function. The probabilistic function is shown in FIG. 5G. If the data are "noisy" such that multiple, unique values may be observed at a given location, an additional variance term may be added to the probabilistic function.

In the previous example of FIGS. 5E-5G, a Gaussian process (GP) was demonstrated for a single spatial variable. However, stochastic processes (SP), and thus Gaussian processes (GP), may be extended to higher dimensions and may include both temporal and spatial dimensions.

Sampling methods may be applied to a geophysical dataset. Similar to applying probability distribution sampling methods to a geophysical model, one reason to implement sampling methods is to reduce computational cost. Sampling methods may include random sampling, active learning, and progressive sampling. With random sampling, every sample available for selection has the same probability of being selected and each sample selection is independent of any other sample selection. Alternatively, progressive learning is based on continuing to sample until accuracy stops improving. Alternatively still, the goal of active learning is to implement sample selection criteria to generate a subset of the dataset that maintains the diversity of the dataset and fully represents the dataset.

Figure 6A:
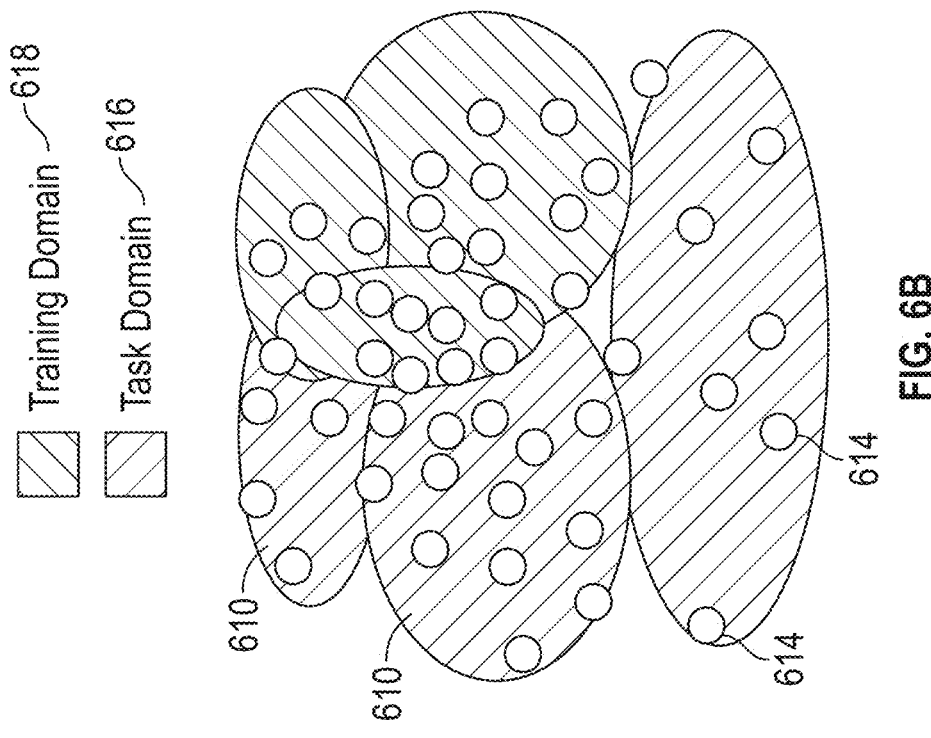
FIG. 6A depicts active learning in accordance with one or more embodiments.
Figure 6B:
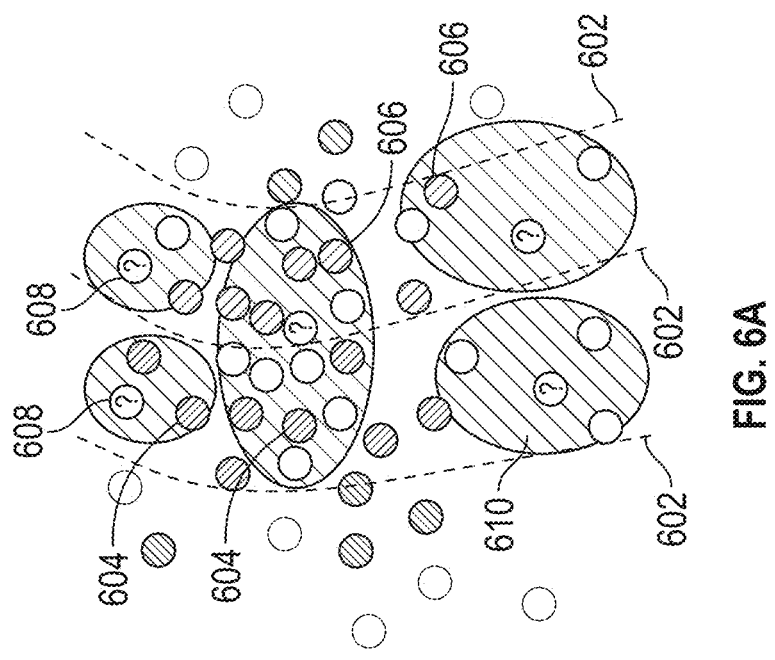
FIG. 6B depicts active learning in accordance with one or more embodiments.

Uncertainty sampling and diversity sampling are two types of active learning that may be used individually or in combination. Uncertainty sampling targets confusing or unexpected samples in the dataset. Diversity sampling targets gaps in the dataset. Simple examples of combining uncertainty sampling and diversity sampling into an active learning scheme is depicted in FIG. 6A and FIG. 6B, in accordance with one or more embodiments. FIG. 6A depicts least confidence sampling with clustering-based sampling. In this example, decision boundaries (602) separate the dataset by label type (label A (604) and label B (606)). Confusing samples (608) or samples where it is unclear if they should be labeled as label A (604) or as label B (606) are sampled. Clusters (610) surrounding the confusing samples (608) are then selected to ensure diverse sampling. FIG. 6B depicts representative cluster-based sampling. Clusters (610) are used to capture distributions, then separated by domain type. For example, the samples (614) may be a training dataset to be used to train a neural network (300) where some samples (614) exist in the target or task domain (616) and other samples (614) exist in the training domain (618). Samples (614) are then selected from the task domain (616). Other examples of active learning include uncertainty sampling with model-based outliers, sampling from the highest entropy cluster, uncertainty sampling and representative sampling, etc.

Figure 7:
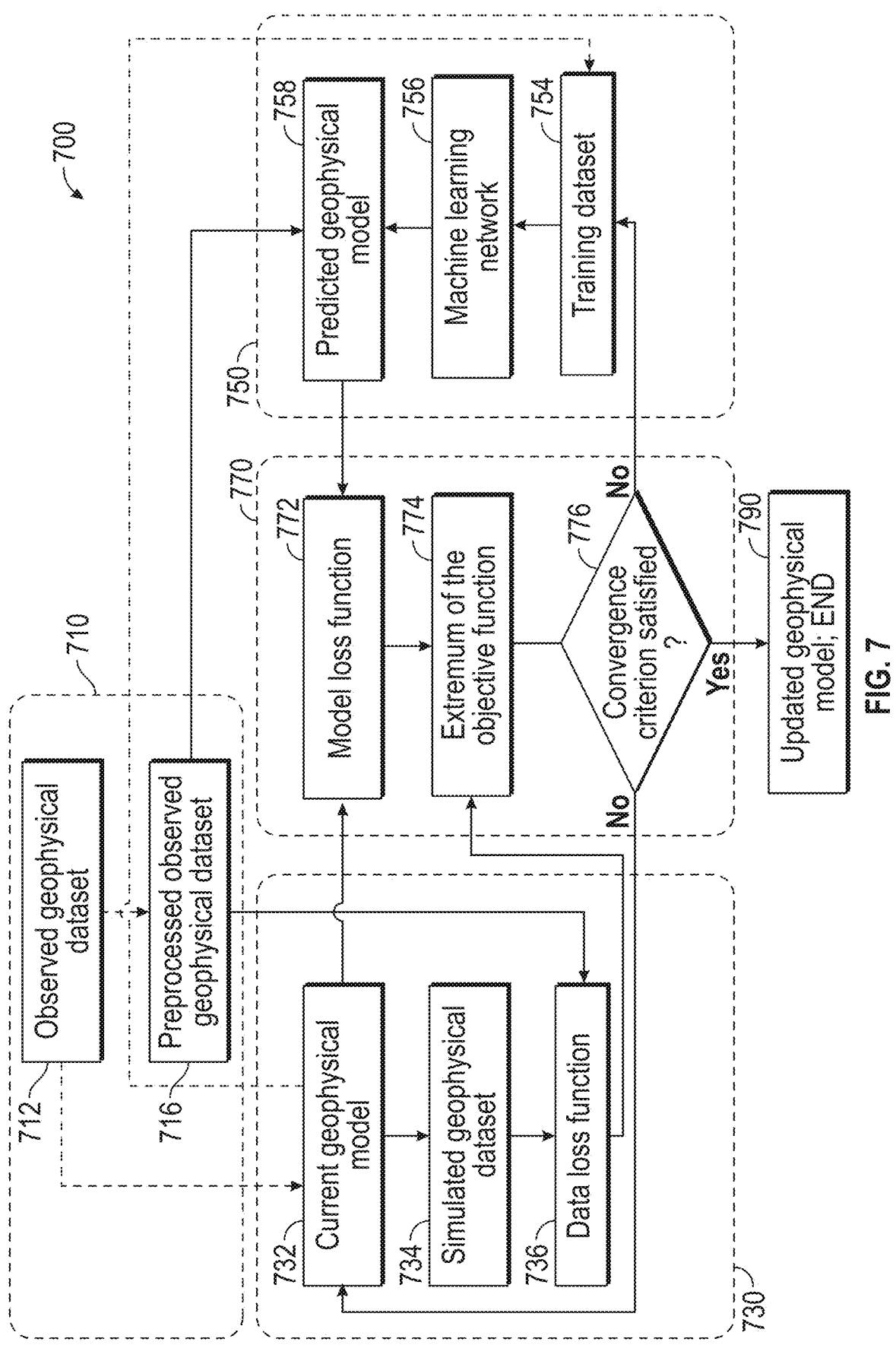
FIG. 7 shows a workflow in according to one or more embodiments

In accordance with one or more embodiments, FIG. 7 shows a flowchart (700) for determining an updated geophysical model of a subterranean region of interest (202). The flowchart (700) is divided into four sections (710, 730, 750 and 770) that are described in turn below.

Turning to section (710), section (710) includes obtaining an observed geophysical dataset (712) from the subterranean region of interest (202). The observed geophysical dataset (712) may be a seismic dataset acquired from a seismic survey (200) as described in FIG. 2. The observed geophysical dataset (712) may also be, without limitation, a gravity dataset, an active source resistivity dataset, a magnetotelluric dataset, or any combination of these datasets.

A preprocessed observed geophysical dataset (716) is determined from the observed geophysical dataset (712). The preprocessing may include applying noise reduction techniques, filtering, and smoothing the observed geophysical dataset (712). In some embodiments, the preprocessing may further include sampling the observed geophysical dataset (716). For example, the sampling may use active learning.

Turning to section (730), in section (730) of the flowchart (700) a current geophysical model (732) is obtained for the subterranean region of interest (202). In accordance with some embodiments, the current geophysical model (732) may be obtained from the observed geophysical dataset (712), for example by crude or approximation methods. In other embodiments, the current geophysical model (732) may be obtained based on assumptions. The assumptions may be about the structure of the subterranean region of interest (202). Assumptions may also be crude, such as that density or seismic velocity increase linearly with depth and are invariant with respect to horizontal location. The current geophysical model (732) may take the form of a three-dimensional (3D) grid with a value or a PD of a model parameter specified at each node. In some embodiments, the 3D grid may be a Cartesian grid and in other embodiments the 3D grid may be an irregular grid. In future steps, the current geophysical model (732) may be updated iteratively and will be explained in detail later.

A simulated geophysical dataset (734) is determined by applying forward modeling to the current geophysical model (732). Forward modeling may be performed by solving mathematical equations that define the physical laws governing the relationship between the simulated geophysical dataset and the current geophysical model. For example, assume the simulated geophysical dataset is a gravity dataset and the current geophysical model is a density model. Then, Newton's law of gravitation is the mathematical equation that can be used to determine the gravity dataset from the density model. Now assume the simulated geophysical dataset is a seismic dataset and the current geophysical model is an elasticity model and density model. Then, Newton's second law of motion and the constitutive relation for elastic materials are the mathematical equations that can be used to determine the seismic dataset from the elasticity model and density model. These mathematical equations may be solved using numerical methods such as, without limitation, finite-difference, finite-element, or discrete Galerkin algorithms.

A data loss function (736) is determined between the simulated geophysical dataset (734) and the preprocessed observed geophysical dataset (716). In some embodiments, the data loss function, $\phi_d$ (m), may be a least-squares loss function:

$$\phi_d(m) = (Gm - d_{obs})^T W_d^T W_d (Gm - d_{obs}) = \|W_d(Gm - d_{obs})\|_{L_2}^2, \quad \text{Equation (6)}$$

where Gm represents the simulated geophysical dataset (734) obtained by applying a Jacobian operator, G, to the current geophysical model (732), m, where $d_{obs}$ is the preprocessed observed geophysical dataset (716), and $W_d$ represents a data weighting matrix (and $$W_d^T W_d$$

is the equivalent inverse covariance). In other embodiments, other data loss functions (736) may be used without departing from the scope of the invention.

Turning to section (750) of the flowchart (700), section (750) depicts a machine learning (ML) network (756) that mimics inversion. In some embodiments, the ML network (756) may be based on Bayesian statistics. Specifically, the ML network may include a neural network (300), a Bayesian method, or a stochastic process (e.g., Gaussian process regression). The ML network (756) may be initialized by providing an initial value for the weights and biases.

A training dataset (754) is used to train the ML network (756). The training dataset (754) includes geophysical training models and a corresponding simulated geophysical training dataset for each geophysical training model. In accordance with one or more embodiments, the training dataset (754) may be based, at least in part, on the current geophysical model (732). For example, in some embodiments, the geophysical training models may be values or PDs of model parameters that are similar to those of the current geophysical model (732). Alternatively, the geophysical training models may be determined by adding a random perturbation to the values or PDs of the model parameters within the current geophysical model (732). The corresponding simulated geophysical training datasets may then be determined by applying forward modelling to the geophysical training models.

Following training of the ML network (756), the ML network (756) is used to predict a predicted geophysical model (758) from the preprocessed observed geophysical dataset (716).

Turning to section (770) of flowchart (700), in section (770) the preprocessed observed geophysical dataset (716) is inverted using the data loss function (736) and a model loss function (772).

The model loss function (772) is determined between the current geophysical model (732) and the predicted geophysical model (758). The model loss function (772) may include one or more terms. The first term of the model loss function (772) may be a measure of the difference between the current geophysical model (732) and the predicted geophysical model (758). The second term of the model loss function (772) may be a measure of the differences in the spatial variation of the current geophysical model (732) and the predicted geophysical model (758). The third term of the model loss function (772) may be a measure of the correlation between the values of current geophysical model (732) and the predicted geophysical model (758).

In accordance with some embodiment, the first term of the model loss function (772), $\phi_m$ (m, m$_p$($\theta$)) may be written as:

$$\phi_m(m, m_p(\theta)) = (m - m_p(\theta))^T W_{m,p}^T W_{m,p}(m - m_p(\theta)), \quad \text{Equation (7)}$$

where m is the current geophysical model (732), m$_p$ is the predicted geophysical model (758), and W$_{m,p}$ is a geophysical model covariance matrix.

In accordance with some embodiments, a second term of the model loss function (772) may be a structural loss function and may measure the dissimilarity between the spatial structure of the current geophysical model (732) and the predicted geophysical model (758). In some embodiments, the structural loss function may be small when discontinuities in the current geophysical model (732) and the predicted geophysical model (758) are coincident with one another. In other embodiments, the structural loss may be small when the spatial gradient of the current geophysical model (732) and the predicted geophysical model (758) are colinear.

For example, in some embodiments the spatial structure loss function, $\phi_{sp}$ (m, m$_p$($\theta$)), may be written as:

$$\phi_{sp}(m, m_p(\theta)) = \quad \text{Equation (8)}$$
$$\sum_{i=1}^{M} \sum_{j=i+1}^{M} \sum_{k=1}^{K} w_{l(i,j,k)} \left| sp_k(m_i, m_{p(j)}(\theta)) \right|^2,$$

where m$_i$ is the model parameters within the current geophysical model (732) and m$_{p(j)}$ is the model parameters within the predicted geophysical model (758) where all model parameters are defined over a 3D grid of K cells, spk is a structure operator vector at the grid cell k, and w$_{l(i,j,k)}$ are the weights.

An objective function may be determined based on the data loss function (736) and the model loss function (772). For example, the objective function may be a weighted sum of the data loss function (736) and the model loss function (772). An extremum of the objective function may be found by updating the current geophysical model (732) that produces the extremum of the objective function. In some embodiments, the extremum may be a minimum, while in other embodiments, the extremum may be a maximum.

A convergence test is performed based on a convergence criterion. In some embodiments, the convergence criterion may depend on the extremum. For example, if the extremum is a minimum, the convergence criterion may be satisfied if the extremum is below a pre-defined threshold. Alternatively, the convergence criterion may be satisfied if the difference between the objective function from one iteration to the next is below a pre-defined threshold. However, if the extremum is a maximum, the convergence criterion may be satisfied if the extremum is above a pre-defined threshold. In other embodiments, the convergence criterion may be that a pre-defined number of iterations within sections (730) and (750) have completed.

In still other embodiments, the convergence criterion may depend on a root mean square error (RMSE) between two geophysical models or two geophysical datasets. For example, the convergence criterion may be satisfied if the root mean square error between the simulated geophysical dataset (734) and the preprocessed observed geophysical dataset (716) is below a pre-defined RMSE threshold. Once the convergence criterion is satisfied, the workflow terminates by assigning the updated current geophysical model as the updated geophysical model (790). If the convergence criterion is not satisfied, sections 730, 750, and 770 are repeated for another iteration using the updated current geophysical model (732). During another iteration, the training dataset (754) may be augmented with the current geophysical model (732) and the simulated geophysical dataset (734) from the previous iteration.

FIG. 8 shows a flowchart (800) for determining an updated geophysical model (790) of a subterranean region of interest (202). In Step 802, an observed geophysical dataset (712) is obtained for the subterranean region of interest (202). In some embodiments, the observed geophysical dataset (712) may be, without limitation, a seismic dataset, a gravity survey dataset, an active source resistivity dataset, or a magneto-telluric dataset.

In Step 804, a preprocessed observed geophysical dataset (716) may be determined based, at least in part, on the observed geophysical dataset (712). Preprocessing may include applying noise reduction techniques, filtering, and smoothing. In some embodiments, preprocessing may include sampling such as random sampling, active learning, and progressive learning.

In Step 806, a current geophysical model (732) may be obtained for the subterranean region of interest (202). The current geophysical model (732) may include a plurality of model parameters of the subterranean region of interest (202). For example, model parameters may include seismic velocity, resistivity, or density. In some embodiments, the current geophysical model (732) may take the form of a three-dimensional (3D) grid with a value of a model parameter specified at each node. Further, the 3D grid may be a Cartesian grid or an irregular grid. The current geophysical model (732) may be initialized using approximation methods relative to the observed geophysical dataset, from well logs (140) recorded in wellbores (104) penetrating the subterranean region of interest (202), or from simplistic assumptions, such as the assumption that density increases linearly with depth. The current geophysical model (732) may be updated during an iterative or recursive loop within the workflow. In some embodiments, each model parameter may be represented by a PD. For example, the PD may be a Gaussian function described by a mean value and a variance. In some embodiments, the PD may be sampled using probability distribution sampling methods such as MCMC methods.

In step 808, a training dataset (754) may be formed. The training dataset (754) may include a plurality of geophysical training models and a corresponding simulated geophysical training dataset for each of the plurality of geophysical training models. In accordance with one or more embodiments, the training dataset (754) may be based, at least in part, on the current geophysical model (732). For example, in some embodiments, the geophysical training models may be similar to the current geophysical model (732). For example, the geophysical training models may be determined by adding random perturbations to the current geophysical model (732). The corresponding simulated geophysical training datasets may then be determined by applying forward modelling, such as physics-based forward modeling, to the geophysical training models. In some embodiments, the training dataset (754) may be sampled, for example by active learning.

In Step 810, a simulated geophysical dataset (734) may be determined by applying forward modeling to the current geophysical model (732). Forward modeling may include physics-based approaches. For example, for geophysical models that are seismic models, a wave equation may be solved using numerical means, such as a finite-difference or finite element method, if the current geophysical model (732) includes the model parameter of seismic velocity as a function of position to determine the simulated geophysical dataset (734).

In Step 812, a data loss function (736) may be determined. The data loss function (736) may measure the difference between the preprocessed observed geophysical dataset (716) and the simulated geophysical dataset (734). For example, the data loss function may be a least-squares function.

In Step 814, a ML network (756) may be trained using the training dataset (754).

In some embodiments, training the ML network may be performed using a supervised learning approach. Further, the ML network may include a Gaussian process regression. If each model parameter is a PD, a Markov chain Monte Carlo method may be used to sample each PD. The trained ML network (756) may be used to predict a predicted geophysical model (758) from the preprocessed observed geophysical dataset (716).

In Step 816, in accordance with one or more embodiments, a model loss function (772) is determined between the current geophysical model (732) and the predicted geophysical model (758).

In Step 818, the current geophysical model (732) may be updated based, at least in part, on an inversion of the preprocessed geophysical dataset (716) using the data loss function (736) and the model loss function (772). The data loss function (736) and the model loss function (772) may be used to determine an objective function. An extremum of the objective function may be found by adjusting the model parameters of the current geophysical model (732). The extremum may be a minimum or a maximum. The adjusted model parameters that produce an extremum of the objective function may be used to update the current geophysical model (732). In other embodiments, inversion may include Bayesian inference.

In Step 820, a convergence test may be performed based on a convergence criterion. If the convergence criterion is satisfied, step 822 may be performed. In step 822, the updated geophysical model (790) may be determined based on the updated current geophysical model (732) and the workflow terminates.

If the convergence criterion is not satisfied in Step 820, Steps 806, 808, 810, 812, 814, 816, 818, and 820 are performed again. For each new iteration, in Step 808 the training dataset (754) may be augmented to include the current geophysical model (732) and the simulated geophysical dataset (734) from the previous iteration. The ML network (756) may be re-trained using the augmented training dataset. Further, in Step 808, the current geophysical model (732) may be replaced by the updated current geophysical model. Steps 806, 808, 810, 812, 814a, 816, 818a, and 820 may be performed in an iterative or recursive loop until the convergence criterion is satisfied.

Figure 9:
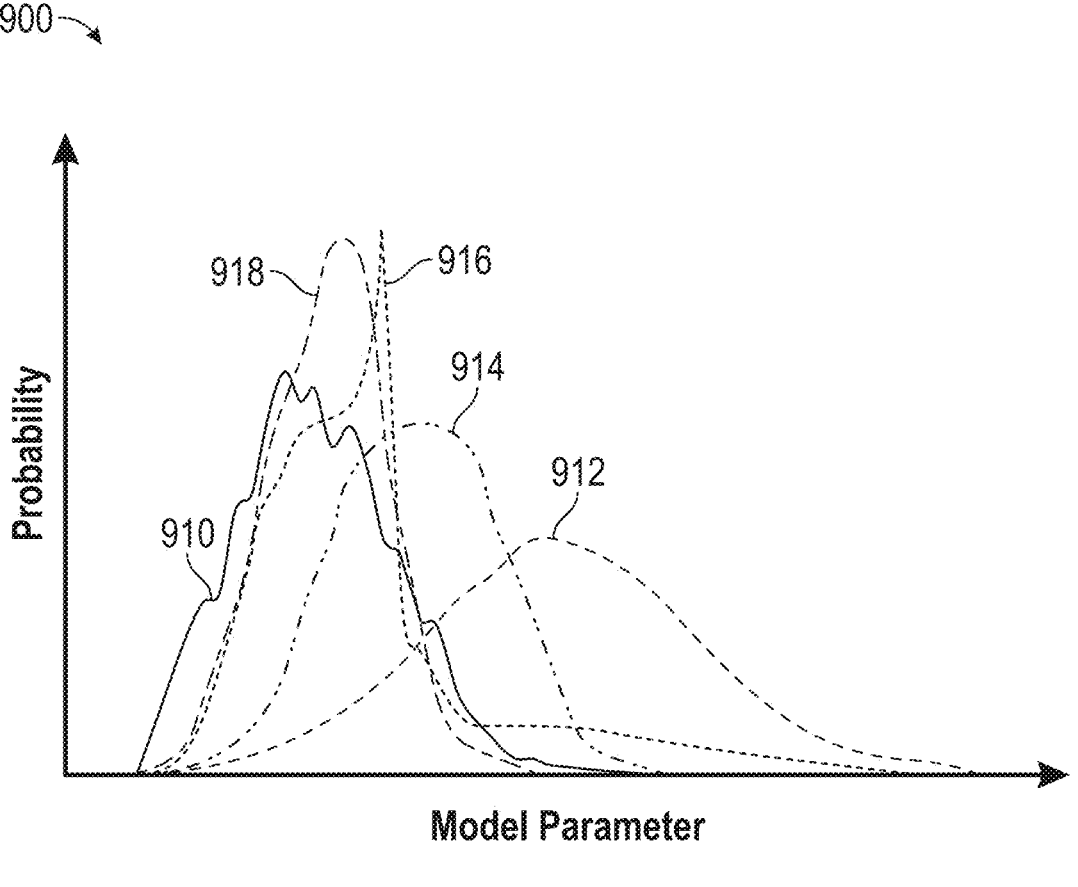
FIG. 9 shows geophysical models in accordance with one or more embodiments.

FIG. 9 depicts geophysical models in accordance with one or more embodiments.

In this embodiment, Bayesian inference is used to update the PD of the current geophysical model (732) determined iteratively in section 730 and update the PD of the predicted geophysical model (758) determined iteratively in section 750. The actual geophysical model (910) is included for reference. In the first iteration k=1 of section 730, the current geophysical model (k=1) (912) presents a larger mean and standard deviation relative to the actual geophysical model (910). In the first iteration k=1 of section 750, the predicted geophysical model (k=1) (914) still presents a larger mean relative to the actual geophysical model (910) but the standard deviation is now similar. As iterations within sections 730 and 750 continue, both the current geophysical model (732) and the predicted geophysical model (758) present decreasing means and standard deviations to become similar to the actual geophysical model (910). Following the last iteration k=n of section 730, the current geophysical model (k=n) (916) is similar to the actual geophysical model (910) with only a slightly larger mean and slightly smaller standard deviation. Following the last iteration k=n of section 750, the predicted geophysical model (k=n) (918) is also similar to the actual geophysical model (910) with only a slightly larger mean and slightly smaller standard deviation. Assuming the convergence criterion is satisfied, the preprocessed observed geophysical dataset (716) is inverted using the data loss function (736) and the model loss function (772) to determine the updated current geophysical model (not shown) which will closely match the actual geophysical model (910).

The updated geophysical model (790) may be used, together with other available information, to determine the location of a hydrocarbon reservoir within a subterranean region of interest (202) with a high degree of certainty. Further the updated geophysical model (790) may be used to determine locations within a hydrocarbon reservoir for which wellbores (104) may be drilled, safely and economically, to produce the hydrocarbons.

Prior to the commencement of drilling, a wellbore plan may be generated. The wellbore plan may include a starting surface location of the wellbore (104), or a subsurface location within an existing wellbore (104), from which the wellbore (104) may be drilled. Further, the wellbore plan may include a terminal location that may intersect with the targeted hydrocarbon bearing formation and a planned wellbore path from the starting location to the terminal location.

Typically, the wellbore plan is generated based on best available information from a geophysical model, geomechanical models encapsulating subterranean stress conditions, the trajectory of any existing wellbores (104) (that must be avoided), and the existence of other drilling hazards, such as shallow gas pockets, over-pressure zones, and active fault plans. Furthermore, the wellbore plan may take into account other engineering constraints such as the maximum wellbore curvature ("dog-log") that the drillstring (105) may tolerate and the maximum torque and drag values that the drilling system (110) may tolerate.

A wellbore planning system may be used to generate the wellbore plan. The wellbore planning system may comprise one or more computer processors in communication with computer memory containing the geophysical and geomechanical models, information relating to drilling hazards, and the constraints imposed by the limitations of the drillstring (105) and the drilling system (110). The wellbore planning system may further include dedicated software to determine the planned wellbore path and associated drilling parameters, such as the planned wellbore diameter, the location of planned changes of the wellbore diameter, the planned depths at which casing will be inserted to support the wellbore (104) and to prevent formation fluids entering the wellbore (104), and the mud weights (densities) and types that may be used during drilling the wellbore (104).

Figure 10A:
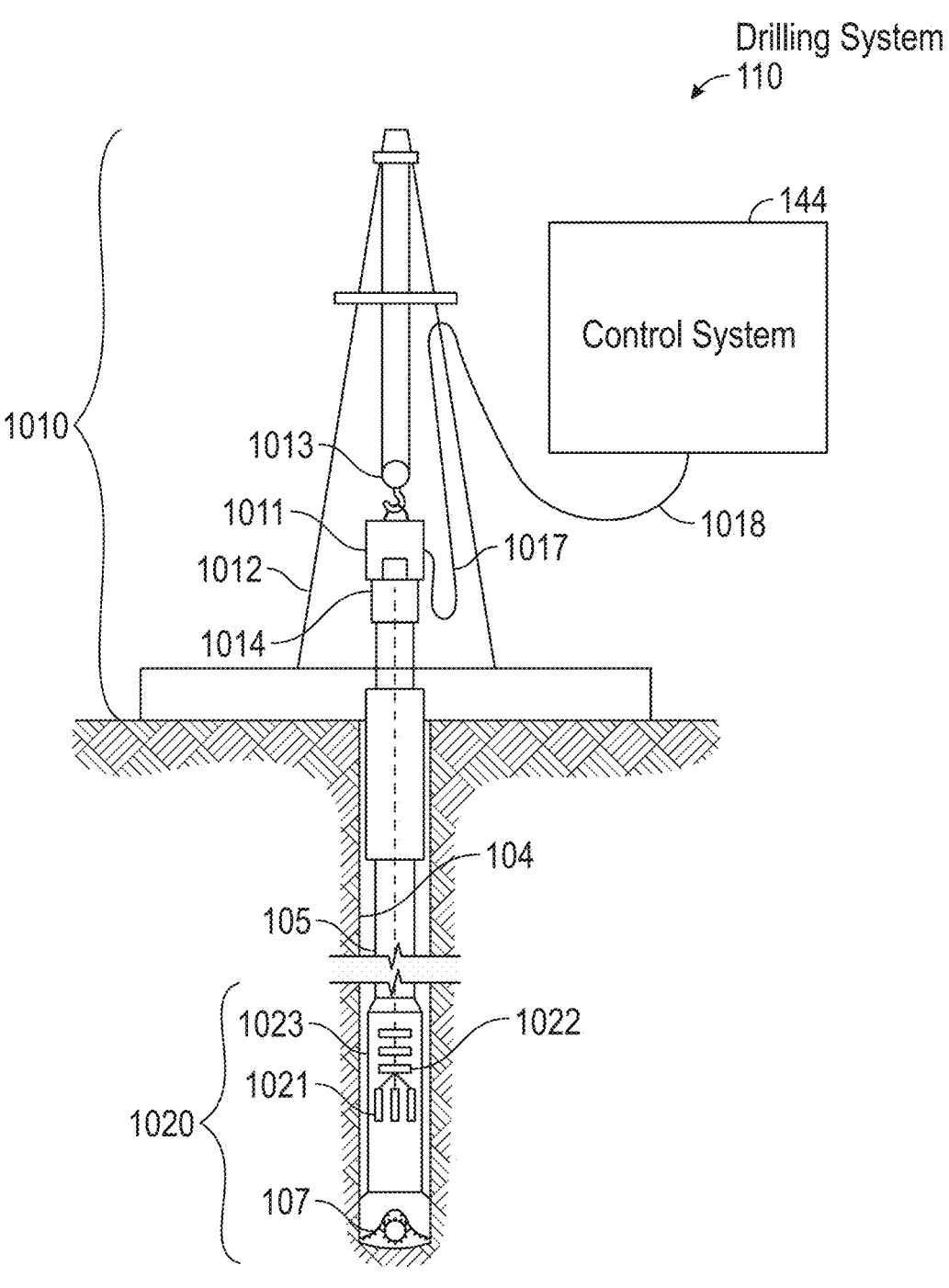
FIGS. 10A and 10B show a system in according to one or more embodiments.
Figure 10B:
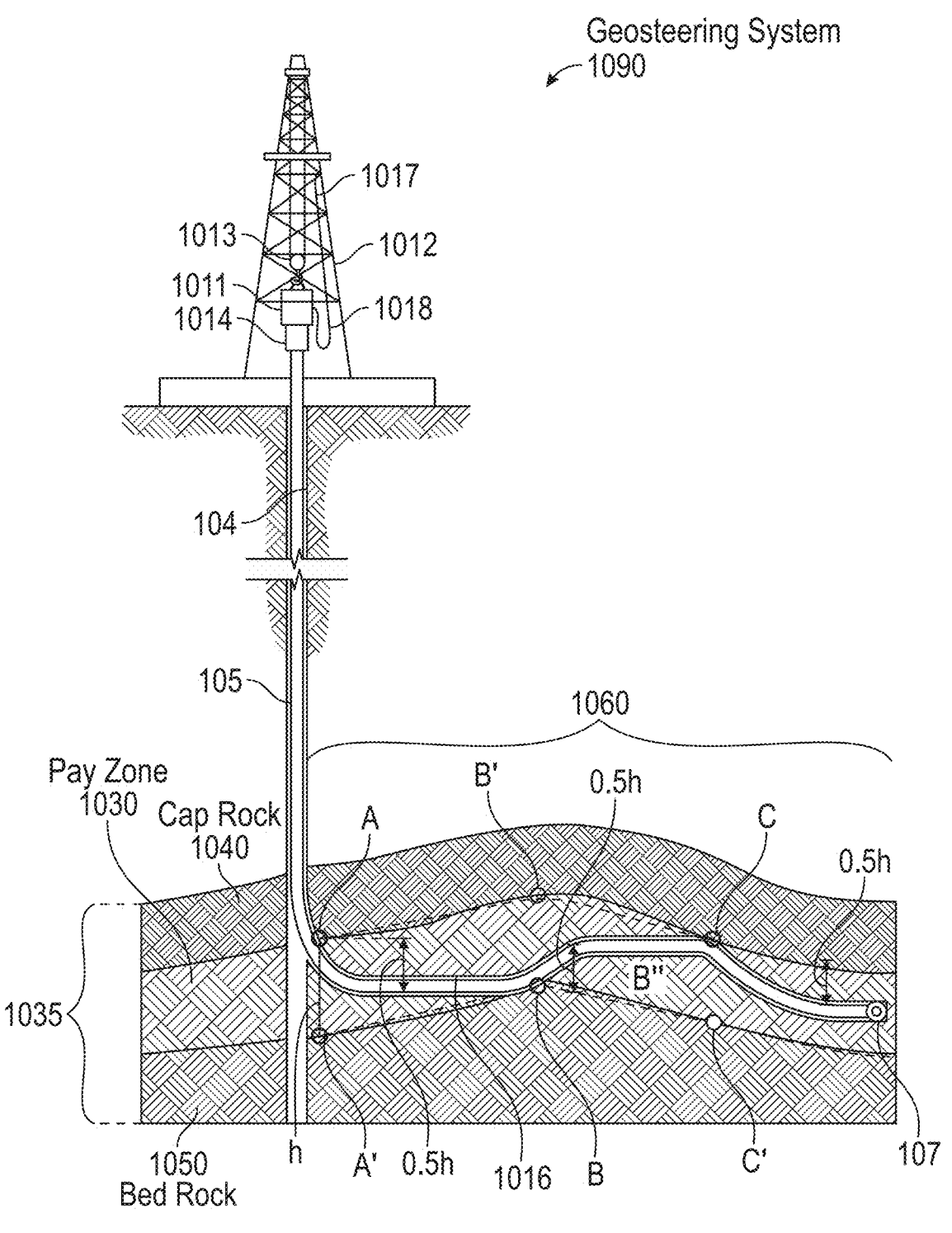

FIGS. 10A and 10B illustrate drilling systems in accordance with one or more embodiments. As shown in FIG. 10A, a drilling system (110) may include a top drive drill rig (1010) arranged around the setup of a drill bit logging tool (1020). A top drive drill rig (1010) may include a top drive (1011) that may be suspended in a derrick (1012) by a travelling block (1013). In the center of the top drive (1011), a drive shaft (1014) may be coupled to a top pipe of a drillstring (105), for example, by threads. The top drive (1011) may rotate the drive shaft (1014), so that the drillstring (105) and a drill bit logging tool (1020) cut the rock at the bottom of a wellbore (104). A power cable (1017) supplying electric power to the top drive (1011) may be protected inside one or more service loops (1018) coupled to a control system (144). As such, drilling mud may be pumped into the wellbore (104) through a mud line, the drive shaft (1014), and/or the drillstring (105).

Moreover, when completing a well (102), casing may be inserted into the wellbore (104). The sides of the wellbore (104) may require support, and thus the casing may be used for supporting the sides of the wellbore (104). As such, a space between the casing and the untreated sides of the wellbore (104) may be cemented to hold the casing in place. The cement may be forced through a lower end of the casing and into an annulus between the casing and a wall (103) of the wellbore (104). More specifically, a cementing plug may be used for pushing the cement from the casing. For example, the cementing plug may be a rubber plug used to separate cement slurry from other fluids, reducing contamination and maintaining predictable slurry performance. A displacement fluid, such as water, or an appropriately weighted drilling mud, may be pumped into the casing above the cementing plug. This displacement fluid may be pressurized fluid that serves to urge the cementing plug downward through the casing to extrude the cement from the casing outlet and back up into the annulus.

As further shown in FIG. 10A, sensors (1021) may be included in a sensor assembly (1023), which is positioned adjacent to a drill bit (107) and coupled to the drillstring (105). Sensors (1021) may also be coupled to a processor assembly (1023) that includes a processor, memory, and an analog-to-digital converter (1022) for processing sensor measurements. For example, the sensors (1021) may include acoustic sensors, such as accelerometers, measurement microphones, contact microphones, and hydrophones. Likewise, the sensors (1021) may include other types of sensors, such as transmitters and receivers to measure resistivity, gamma ray detectors, etc. The sensors (1021) may include hardware and/or software for generating different types of well logs (140) (such as acoustic logs or density logs) that may provide well data about a wellbore (104), including porosity of wellbore sections, gas saturation, bed boundaries in a geologic formation, fractures in the wellbore (104) or completion cement, and many other pieces of information about a formation (106). If such well data is acquired during drilling operations (i.e., logging-while-drilling), then the information may be used to make adjustments to drilling operations in real-time. Such adjustments may include rate of penetration (ROP), drilling direction, altering mud weight, and many others drilling parameters.

In some embodiments, acoustic sensors may be installed in a drilling fluid circulation system of a drilling system (110) to record acoustic drilling signals in real-time. Drilling acoustic signals may transmit through the drilling fluid to be recorded by the acoustic sensors located in the drilling fluid circulation system. The recorded drilling acoustic signals may be processed and analyzed to determine well data, such as lithological and petrophysical properties of the rock formation. This well data may be used in various applications, such as steering a drill bit (107) using geosteering, casing shoe positioning, etc.

The control system (144) may be coupled to the sensor assembly (1023) in order to perform various program functions for up-down steering and left-right steering of the drill bit (107) through the wellbore (104). More specifically, the control system (144) may include hardware and/or software with functionality for geosteering a drill bit (107) through a formation (106) in a lateral well (102) using sensor signals, such as drilling acoustic signals or resistivity measurements. For example, the formation (106) may be a hydrocarbon reservoir region, such as a pay zone (1030), bed rock (1050), or cap rock (1040).

Turning to geosteering, geosteering may be used to position the drill bit (107) or drillstring (105) relative to a boundary between different subsurface layers (e.g., overlying, underlying, and lateral layers of a pay zone (1030)) during drilling operations. In particular, measuring rock properties during drilling may provide the drilling system (110) with the ability to steer the drill bit (107) in the direction of desired hydrocarbon concentrations. As such, a geosteering system (1090) may use various sensors located inside or adjacent to the drillstring (105) to determine different rock formations (106) within a wellbore path. In some geosteering systems (1090), drilling tools may use resistivity or acoustic measurements to guide the drill bit (107) during horizontal or lateral drilling.

Turning to FIG. 10B illustrates some embodiments for steering a drill bit (107) through a lateral pay zone (1030) using a geosteering system (1090). As shown in FIG. 10B, the geosteering system (1090) may include the drilling system (110) from FIG. 10A. In particular, the geosteering system (1090) may include functionality for monitoring various sensor signatures (e.g., an acoustic signature from acoustic sensors) that gradually or suddenly change as a well path traverses a cap rock (1040), a pay zone (1030), and a bed rock (1050). Because of the sudden change in lithology between the cap rock (1040) and the pay zone (1030), for example, a sensor signature of the pay zone (1030) may be different from the sensor signature of the cap rock (1040). When the drill bit (107) drills out of the pay zone (1030) into the cap rock (1040), a detected amplitude spectrum of a particular sensor type may change suddenly between the two distinct sensor signatures. In contrast, when drilling from the pay zone (1030) downward into the bed rock (1050), the detected amplitude spectrum may gradually change.

During the lateral drilling of the wellbore (104), preliminary upper and lower boundaries of a formation layer's thickness may be derived from a seismic survey (200) and/or an offset well (102) obtained before drilling the wellbore (104). If a vertical section (1035) of the well (102) is drilled, the actual upper and lower boundaries of a formation layer (i.e., actual pay zone boundaries (A, A')) and the pay zone thickness (i.e., A to A') at the vertical section (1035) may be determined. Based on this well data, an operator may steer the drill bit (107) through a lateral section (1060) of the wellbore (104) in real-time. In particular, a logging tool (113) may monitor a detected sensor signature proximate the drill bit (107), where the detected sensor signature may continuously be compared against prior sensor signatures, e.g., of the cap rock (1040), pay zone (1030), and bed rock (1050), respectively. As such, if the detected sensor signature of drilled rock is the same or similar to the sensor signature of the pay zone (1030), the drill bit (107) may still be drilling in the pay zone (1030). In this scenario, the drill bit (107) may be operated to continue drilling along its current path and at a predetermined distance (0.5 h) from a boundary of a formation layer. If the detected sensor signature is same as or similar to the prior sensor signatures of the cap rock (1040) or the bed rock (1050), respectively, then the control system (144) may determine that the drill bit (107) is drilling out of the pay zone (1030) and into the upper or lower boundary of the pay zone (1030). At this point, the vertical position of the drill bit (107) at this lateral position within the wellbore (104) may be determined and the upper and lower boundaries of the pay zone (1030) may be updated, (for example, positions B and C in FIG. 10B). In some embodiments, the vertical position at the opposite boundary may be estimated based on the predetermined thickness of the pay zone (1030), such as positions B' and C'.

While FIGS. 10A, and 10B shows various configurations of components, other configurations may be used without departing from the scope of the disclosure. For example, various components in FIGS. 10A, and 10B may be combined to create a single component. As another example, the functionality performed by a single component may be performed by two or more components.

Figure 11:
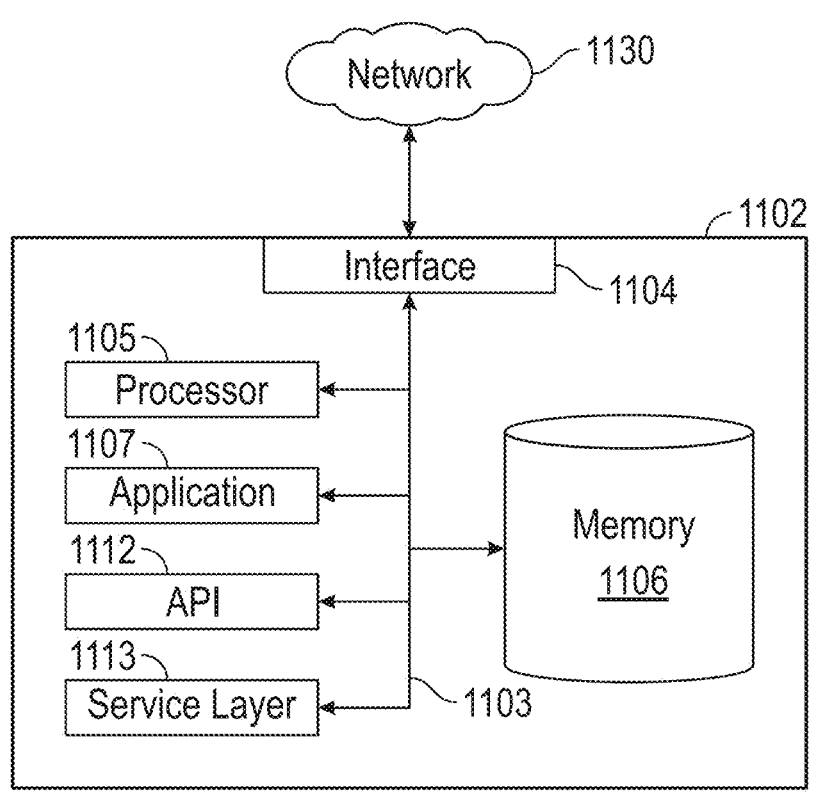
FIG. 11 shows a system in according to one or more embodiments.

FIG. 11 further depicts a block diagram of a computer system (1102) used to provide computational functionalities associated with described algorithms, methods, functions, processes, flows, and procedures as described in this disclosure, according to one or more embodiments. In particular, FIG. 11 may depict a ML engine for performing the method for determining an updated geophysical model (790) for a subterranean region of interest (202).

The illustrated computer (1102) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (1102) may include an input device, such as a keypad, keyboard, touch screen, or other device that can accept user information, and an output device that conveys information associated with the operation of the computer (1102), including digital data, visual, or audio information (or a combination of information), or a GUI.

The computer (1102) can serve in a role as a client, network component, a server, a database or other persistency, or any other component (or a combination of roles) of a computer system for performing the subject matter described in the instant disclosure. The illustrated computer (1102) is communicably coupled with a network (1130). In some implementations, one or more components of the computer (1102) may be configured to operate within environments, including cloud-computing-based, local, global, or other environment (or a combination of environments).

At a high level, the computer (1102) is an electronic computing device operable to receive, transmit, process, store, or manage data and information associated with the described subject matter. According to some implementations, the computer (1102) may also include or be communicably coupled with an application server, e-mail server, web server, caching server, streaming data server, business intelligence (BI) server, or other server (or a combination of servers).

The computer (1102) can receive requests over network (1130) from a client application (for example, executing on another computer (1102) and responding to the received requests by processing the said requests in an appropriate software application. In addition, requests may also be sent to the computer (1102) from internal users (for example, from a command console or by other appropriate access method), external or third-parties, other automated applications, as well as any other appropriate entities, individuals, systems, or computers.

Each of the components of the computer (1102) can communicate using a system bus (1103). In some implementations, any or all of the components of the computer (1102), both hardware or software (or a combination of hardware and software), may interface with each other or the interface (1104) (or a combination of both) over the system bus (1103) using an application programming interface (API) (1112) or a service layer (1113) (or a combination of the API (1112) and service layer (1113). The API (1112) may include specifications for routines, data structures, and object classes. The API (1112) may be either computer-language independent or dependent and refer to a complete interface, a single function, or even a set of APIs. The service layer (1113) provides software services to the computer (1102) or other components (whether or not illustrated) that are communicably coupled to the computer (1102). The functionality of the computer (1102) may be accessible for all service consumers using this service layer. Software services, such as those provided by the service layer (1113), provide reusable, defined business functionalities through a defined interface. For example, the interface may be software written in JAVA, C++, or other suitable language providing data in extensible markup language (XML) format or another suitable format. While illustrated as an integrated component of the computer (1102), alternative implementations may illustrate the API (1112) or the service layer (1113) as stand-alone components in relation to other components of the computer (1102) or other components (whether or not illustrated) that are communicably coupled to the computer (1102). Moreover, any or all parts of the API (1112) or the service layer (1113) may be implemented as child or sub-modules of another software module, enterprise application, or hardware module without departing from the scope of this disclosure.

The computer (1102) includes an interface (1104). Although illustrated as a single interface (1104) in FIG. 11, two or more interfaces (1104) may be used according to particular needs, desires, or particular implementations of the computer (1102). The interface (1104) is used by the computer (1102) for communicating with other systems in a distributed environment that are connected to the network (1130). Generally, the interface (1104) includes logic encoded in software or hardware (or a combination of software and hardware) and operable to communicate with the network (1130). More specifically, the interface (1104) may include software supporting one or more communication protocols associated with communications such that the network (1130) or interface's hardware is operable to communicate physical signals within and outside of the illustrated computer (1102).

The computer (1102) includes at least one computer processor (1105). Although illustrated as a single computer processor (1105) in FIG. 11, two or more processors may be used according to particular needs, desires, or particular implementations of the computer (1102). Generally, the computer processor (1105) executes instructions and manipulates data to perform the operations of the computer (1102) and any algorithms, methods, functions, processes, flows, and procedures as described in the instant disclosure.

The computer (1102) also includes a memory (1106) that holds data for the computer (1102) or other components (or a combination of both) that can be connected to the network (1130). For example, memory (1106) may be a non-transitory computer readable medium memory (1106) can be a database storing data consistent with this disclosure. Although illustrated as a single memory (1106) in FIG. 11, two or more memories (1106) may be used according to particular needs, desires, or particular implementations of the computer (1102) and the described functionality. While memory (1106) is illustrated as an integral component of the computer (1102), in alternative implementations, memory (1106) can be external to the computer (1102).

The application (1107) is an algorithmic software engine providing functionality according to particular needs, desires, or particular implementations of the computer (1102), particularly with respect to functionality described in this disclosure. For example, application (1107) can serve as one or more components, modules, applications, etc. Further, although illustrated as a single application (1107), the application (1107) may be implemented as multiple applications (1107) on the computer (1102). In addition, although illustrated as integral to the computer (1102), in alternative implementations, the application (1107) can be external to the computer (1102).

There may be any number of computers (1102) associated with, or external to, a computer system containing a computer (1102), wherein each computer (1102) communicates over network (1130). Further, the term "client," "user," and other appropriate terminology may be used interchangeably as appropriate without departing from the scope of this disclosure. Moreover, this disclosure contemplates that many users may use one computer (1102), or that one user may use multiple computers (1102).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed:

1. A method comprising:
iteratively:
   obtaining an observed geophysical dataset from a subterranean region of interest;
   determining, using a computer processor, a preprocessed observed geophysical dataset based on the observed geophysical dataset;
   obtaining a current geophysical model of the subterranean region of interest;
   forming a training dataset comprising a plurality of geophysical training models and a corresponding simulated geophysical training dataset for each of the plurality of geophysical training models;
   performing inversion comprising iteratively or recursively, using the computer processor, until a convergence criterion is satisfied:
      determining a simulated geophysical dataset by applying forward modeling to the current geophysical model,
      determining a data loss function between the preprocessed observed geophysical dataset and the simulated geophysical dataset,
      training a machine learning (ML) network, using the training dataset, to predict a predicted geophysical model from the preprocessed observed geophysical dataset,
      inputting the preprocessed observed geophysical dataset into a trained machine learning network, wherein the trained machine learning network comprises Bayesian inference;
      producing a predicted geophysical model from the trained machine learning network using the preprocessed observed geophysical dataset,
         wherein the predicted geophysical model comprises a plurality of model parameters, and
         wherein each model parameter among the plurality of model parameters comprises a probability distribution of each model parameter,
      determining a model loss function between the current geophysical model and the predicted geophysical model,
      forming an objective function based on the data loss function and the model loss function,
      determining a value of the objective function, and
      updating the current geophysical model based on the value; and
   locating a hydrocarbon reservoir based on the updated current geophysical model;
   planning a wellbore path to the hydrocarbon reservoir;
   drilling, using a geosteering system, a wellbore guided by the wellbore path comprising updating a position of a drill bit of the geosteering system based on the updated current geophysical model;
   determining, using the geosteering system and during drilling, acoustic measurements; and
   updating the observed geophysical dataset using the acoustic measurements.

2. The method of claim 1, wherein determining the preprocessed observed geophysical dataset comprises sampling the observed geophysical dataset.

3. The method of claim 1, wherein training the machine learning network comprises sampling a training dataset.

4. The method of claim 3, wherein sampling comprises active learning.

5. The method of claim 1, wherein the Bayesian inference comprises a Markov chain Monte Carlo method.

6. The method of claim 1, wherein the machine learning network comprises Gaussian process regression.

7. The method of claim 1, wherein the observed geophysical dataset comprises a seismic dataset.

8. The method of claim 1, wherein the trained machine learning network comprises a supervised machine learning network.

9. The method of claim 1, wherein training the trained machine learning network comprises:

augmenting a training dataset with the updated current geophysical model and the simulated geophysical dataset; and retraining the trained machine learning network based on the augmented training dataset.

10. A system comprising:

a seismic acquisition system configured to obtain an observed geophysical dataset from a subterranean region of interest;

a computer system configured to, iteratively:

receive the observed geophysical dataset, determine a preprocessed observed geophysical dataset based on the observed geophysical dataset, receive a current geophysical model of the subterranean region of interest, form a training dataset comprising a plurality of geophysical training models and a corresponding simulated geophysical training dataset for each of the plurality of geophysical training models;

perform inversion comprising iteratively or recursively, until a convergence criterion is satisfied:

determine a simulated geophysical dataset by applying forward modeling to the current geophysical model;

determine a data loss function between the preprocessed observed geophysical dataset and the simulated geophysical dataset;

train a machine learning (ML) network, using the training dataset, to predict a predicted geophysical model from the preprocessed observed geophysical dataset, input the preprocessed observed geophysical dataset into a trained machine learning network, wherein the trained machine learning network comprises Bayesian inference;

produce a predicted geophysical model from the trained machine learning network using the preprocessed observed geophysical dataset, wherein the predicted geophysical model comprises a plurality of model parameters, and wherein each model parameter among the plurality of model parameters comprises a probability distribution of each model parameter;

determine a model loss function between the current geophysical model and the predicted geophysical model;

form an objective function based on the data loss function and the model loss function;

determine a value of the objective function;

update the current geophysical model based on the value, and locate a hydrocarbon reservoir based on the updated current geophysical model;

a wellbore planning system configured to plan a wellbore path to the hydrocarbon reservoir; and a geosteering system configured to:

drill a wellbore guided by the wellbore path comprising update a position of a drill bit of the geosteering system based on the updated current geophysical model, and determine, during drilling, acoustic measurements;

wherein the computer system is further configured to update the observed geophysical dataset using the acoustic measurements.

* * * * *